(12) United States Patent
Sershen et al.

(10) Patent No.: US 9,783,888 B2
(45) Date of Patent: *Oct. 10, 2017

(54) ATOMIC LAYER DEPOSITION HEAD

(71) Applicant: Ultratech, Inc., San Jose, CA (US)

(72) Inventors: Michael J. Sershen, Cambridge, MA (US); Ganesh M. Sundaram, Concord, MA (US); Roger R. Coutu, Hooksett, NH (US); Jill Svenja Becker, Cambridge, MA (US); Mark J. Dalberth, Somerville, MA (US)

(73) Assignee: Ultratech, Inc., San Jose, CA (US)

( * ) Notice: Subject to any disclaimer, the term of this patent is extended or adjusted under 35 U.S.C. 154(b) by 21 days.

This patent is subject to a terminal disclaimer.

(21) Appl. No.: 14/957,273

(22) Filed: Dec. 2, 2015

(65) Prior Publication Data

US 2016/0115596 A1    Apr. 28, 2016

Related U.S. Application Data

(60) Continuation of application No. 14/584,034, filed on Dec. 29, 2014, now Pat. No. 9,567,670, which is a (Continued)

(51) Int. Cl.
*C23C 16/00* (2006.01)
*C23C 16/455* (2006.01)
(Continued)

(52) U.S. Cl.
CPC .... *C23C 16/45574* (2013.01); *C23C 16/4412* (2013.01); *C23C 16/453* (2013.01); (Continued)

(58) Field of Classification Search
USPC ............ 118/715, 724, 729, 313–315, 325; 257/E21.529, E21.482
See application file for complete search history.

(56) References Cited

U.S. PATENT DOCUMENTS 5,782,978 A    7/1998  Kinose et al.
5,972,426 A    10/1999 Kutsuzawa et al.
(Continued)

FOREIGN PATENT DOCUMENTS

EP    2441860 A1    4/2012
JP    H11-335868 A  12/1999
(Continued)

OTHER PUBLICATIONS

English Translation of Japanese Office Action dated Jun. 2, 2015, application No. 534022/2013.
(Continued)

*Primary Examiner* — Yewebdar Tadesse
(74) *Attorney, Agent, or Firm* — Royse Law Firm, PC

(57) ABSTRACT

An ALD coating method to provide a coating surface on a substrate is provided. The ALD coating method comprises: providing a deposition heading including a unit cell having a first precursor nozzle assembly and a second precursor nozzle assembly; emitting a first precursor from the first precursor nozzle assembly into chamber under atmospheric conditions in a direction substantially normal to the coating surface; emitting a second precursor from the first precursor nozzle assembly into chamber under atmospheric conditions in a direction substantially normal to the coating surface; removing moving the substrate under the deposition head such that the first precursor is directed onto a first area of the coating surface prior to the second precursor being directed onto the first area of the coating surface.

15 Claims, 15 Drawing Sheets

Related U.S. Application Data division of application No. 13/273,417, filed on Oct. 14, 2011, now abandoned.

(60) Provisional application No. 61/466,885, filed on Mar. 23, 2011, provisional application No. 61/455,772, filed on Oct. 26, 2010, provisional application No. 61/455,223, filed on Oct. 16, 2010.

(51) Int. Cl.
| | |
|---|---|
| *C23C 16/54* | (2006.01) |
| *C23C 16/453* | (2006.01) |
| *C23C 16/458* | (2006.01) |
| *C23C 16/44* | (2006.01) |

(52) U.S. Cl.
CPC .... *C23C 16/4584* (2013.01); *C23C 16/45544* (2013.01); *C23C 16/45551* (2013.01); *C23C 16/45557* (2013.01); *C23C 16/545* (2013.01)

(56) References Cited

U.S. PATENT DOCUMENTS

| | | | |
|---|---|---|---|
| 6,495,005 B1 * | 12/2002 | Colgan | C25D 7/12 204/196.15 |
| 6,821,563 B2 | 11/2004 | Yukovsky | |
| 6,821,910 B2 | 11/2004 | Adomaitis et al. | |
| 7,093,375 B2 | 8/2006 | O'Donnell | |
| 7,383,843 B2 | 6/2008 | Ravkin | |
| 7,413,982 B2 | 8/2008 | Levy | |
| 7,456,429 B2 | 11/2008 | Levy | |
| 7,572,686 B2 | 8/2009 | Levy et al. | |
| 7,887,884 B2 | 2/2011 | Mieno | |
| 9,567,670 B2 * | 2/2017 | Sershen | C23C 16/45551 |
| 2001/0004881 A1 | 6/2001 | Miller et al. | |
| 2002/0053395 A1 | 5/2002 | Ui et al. | |
| 2002/0094370 A1 | 7/2002 | Ito | |
| 2005/0188920 A1 | 9/2005 | Shimoda | |
| 2005/0208215 A1 | 9/2005 | Eguchi et al. | |
| 2005/0221044 A1 | 10/2005 | Kilpela et al. | |
| 2006/0216947 A1 | 9/2006 | Choi et al. | |
| 2007/0281089 A1 | 12/2007 | Heller et al. | |
| 2008/0032063 A1 | 2/2008 | Chang et al. | |
| 2008/0166884 A1 | 7/2008 | Nelson et al. | |
| 2009/0104789 A1 | 4/2009 | Mallick et al. | |
| 2009/0130858 A1 | 5/2009 | Levy | |
| 2009/0258504 A1 | 10/2009 | Nakaiso et al. | |
| 2009/0291211 A1 | 11/2009 | Ryu et al. | |
| 2009/0304924 A1 | 12/2009 | Gadgil | |
| 2010/0166955 A1 | 7/2010 | Becker et al. | |
| 2010/0326358 A1 | 12/2010 | Choi | |
| 2012/0196050 A1 | 8/2012 | Vermeer et al. | |
| 2013/0064977 A1 | 3/2013 | Vermeer et al. | |

FOREIGN PATENT DOCUMENTS

| | | |
|---|---|---|
| JP | 2005-116900 A | 4/2005 |
| TW | 201002846 A | 1/2010 |
| TW | 201016869 A | 5/2010 |
| WO | 2008/093115 A1 | 8/2008 |
| WO | 2011/014070 A1 | 2/2011 |

OTHER PUBLICATIONS

Taiwanese Office Action and English Translation dated Sep. 4, 2015, application No. 100137282.
Machine Translation of JP 2005-116900.
Machine Translation of JP H11-335868.
International Search Report from PCT/US11/56268, dated Mar. 8, 2012.
Korean Office Action dated Apr. 10, 2017, application No. 10-2013-7012531.
Translation of Korean Office Action dated Apr. 10, 2017, application No. 10-2013-7012531.

* cited by examiner

ATOMIC LAYER DEPOSITION HEAD

CROSS-REFERENCE TO RELATED APPLICATIONS

This application is a continuation of U.S. patent application Ser. No. 14/584,034 filed on Dec. 29, 2014 which is a divisional of U.S. patent application Ser. No. 13/273,417, filed Oct. 14, 2011, which claims priority under 35 U.S.C. 119(e) based upon each of Provisional Application No. 61/455,223, filed Oct. 16, 2010, Provisional Application No. 61/455,772, filed Oct. 26, 2010, and Provisional Application No. 61/466,885, filed Mar. 23, 2011, all of which are incorporated herein by reference in their entirety.

COPYRIGHT NOTICE

A portion of the disclosure of this patent document may contain material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice shall apply to this document: Copyright 2011, Cambridge Nanotech, Inc.

BACKGROUND OF THE INVENTION

Field of the Invention

The present invention relates to methods and apparatus for gas deposition. More specifically the present invention relates to devices and methods suitable for applying multiple thin film materials layers onto a moving substrate by atomic layer deposition (ALD) carried out at atmospheric pressure.

Description of the Related Art

Systems for coating moving substrates at atmospheric pressure using ALD coating methods are known and disclosed in U.S. Pat. No. 7,413,982 by Levy et al. entitled PROCESS FOR ATOMIC LAYER DEPOSITION and related disclosures by Levy et al. Levy et al. disclose in FIGS. 2 and 5 a gas distribution manifold having three gas inlet ports for receiving a first precursor gas, a second precursor gas and an inert gas therein. The distribution manifold is formed with an output face having a plurality of output channels with first output channels emitting the first precursor gas out therefrom, second output channels emitting the second precursor gas out therefrom and third output channels, disposed between each of first and second output channels, emitting the inert gas out therefrom. The output face is disposed opposed to a substrate coating surface and is uniformly spaced apart from the substrate coating surface by a distance D such that each output channel is separated from the coating surface by the distance D. The output channels are separated by partitions which are shared by adjacent output channels. The partitions substantially confine gas flow to channels defined by opposing partitions. Gas is delivered into each output channel is directed parallel to the substrate coating surface and is confined to flow in the output channel by the partitions and the substrate coating surface.

In operation, the distribution manifold and or substrate are moved relative to one another. The direction of relative motion is perpendicular to the direction of gas flow in the output channels. The relative motion sequentially advances each output channel over the coating surface. Thus the coating surface is first exposed to the first precursor flowing through a first output channel. During the period that the coating surface is exposed to the first precursor the first precursor reacts with the substrate coating surface to alter the coating surface and produce a reaction byproduct. The coating surface is next exposed to an inert gas flowing through an inert gas output channel. As shown in Levy et al. FIGS. 7A and 7B the inert gas channel removes unreacted first precursor and reaction byproduct from the coating surface and carries the outflow to an exhaust port. The coating surface is next exposed to the second precursor gas flowing through a second output channel. During the period that the coating surface is exposed to the second precursor the second precursor reacts with the substrate coating surface and forms a thin film solid coating thereon and produces a reaction byproduct. The coating surface is next exposed to a second inert gas flowing through an inert gas output channel which removes unreacted second precursor and reaction byproduct from the coating surface.

It is well know that mixed precursor gases readily react with each other and most surfaces that they come into contact with and that mixed precursors contaminate the surfaces by forming solid material layers thereon. When mixed precursors contaminate a substrate coating surface its physical and chemical properties can be compromised with very little visible sign that the surface is contaminated. In the case of the distribution manifold disclosed by Levy et al., mixed precursors in the inert gas channels can contaminate surfaces of the distribution manifold and other surfaces of the exhaust system, including pump valves and sensors that come into contact with the outflow. Surface contamination resulting from contact with mixed precursor usually leads to performance degradation and eventual failure.

One problem with the distribution manifold disclosed by Levy et al. is that the separation distance D between the coating surface and the output face of the distribution manifold is necessary small. In particular, Levy et al. disclose that a separation D of approximately 0.025 mm, or 25 µm is advantageous because it prevents precursor gases from flowing around channel partitions between the distribution head and the coating surface thereby preventing different precursors from mixing together, e.g. in the inert gas channels. Additionally Levy et al. discloses in FIGS. 8A and 8B that a small separation D advantageously reduces the reaction time of a precursor with the coating surface since the precursor reaches the coating surface more quickly. However Applicants have found that the small separation distance D is not practical in a typical coating application because many substrate materials being coated have, surface variations that exceed 25 µm; the separation distance recommended in Levy et al. In particular variations in substrate thickness, in the geometry of elements supporting the substrate and in the manifold itself can easily exceed 25 µm with the result that during movement of the coating surface past the distribution manifold at the desired coating velocity contact between the coating surface and the distribution manifold can easily occur resulting undesirable coating surface and substrate damage.

While Levy et al. argue that the small separation D is an improvement over the prior gas deposition system disclosed in U.S. Pat. No. 6,821,563 to Yudovsky, entitled GAS DISTRIBUTION SYSTEM FOR CYCLICAL LAYER DEPOSITION, the Yudovsky system uses a separation distance of 500 µm or more which is a more practical separation for coating moving surfaces.

Yudovsky discloses a cyclic layer deposition system in FIG. 1 that includes a sealed processing chamber maintained at less than atmospheric pressure during coating cycles. The system includes a gas distribution manifold supported inside the process chamber in a fixed position. The system includes a shuttle that supports a substrate being coated and transports the substrate past the gas distribution manifold in a liner motion. The distribution manifold includes first gas ports connected to a first precursor supply for receiving a first precursor gas therein, second precursor ports connected to a second precursor gas supply for receiving a second precursor gas therein, purge ports connected to an inert gas supply for receiving inert gas therein and vacuum ports connected to a vacuum system for removing gas from the process chamber. The gas ports are arranged with each precursor port flanked by opposing pump ports and with a purge port disposed between opposing first and second precursor ports.

Each of the gas port is separated from adjacent gas ports by partitions. The partitions extend close to the substrate coating surface and isolate gas flow from adjacent gas ports and direct gas flow toward the coating surface. Each gas port has an open end facing the coating surface such that gas exiting from gas ports impinges the coatings surface to either react with the coating surface as is the case for the precursor gases or purge precursors from the coating surface as the case for the inert gas exiting from the purge ports. A lower end of each partition is separated from the coatings surface by a separation spacing of about 500 µm or more to allow gas streams exiting from precursor ports to flow around the lower end of the partitions toward the adjacent vacuum ports.

While the gas distribution manifold disclosed by Yudovsky provides a more practical separation distance between the lower end of each partition and the coating surface Yudovsky suffers from other shortcomings. In particular, Yudovsky requires that the process chamber be sealed and the coating process be carried out in vacuum or at least below atmospheric pressure. This complicates loading and unloading of substrates which are transported between a load lock chamber and the process chamber at the beginning and end of each coating cycle and this substantially increases coating cycle times. Additionally Yudovsky requires that the substrate be moved past the distribution manifold by a reciprocating linear motion or that individual wafers be rotated past the gas distribution manifold a shown in FIGS. 3 and 5. This further increases process cycle times by requiring two linear motion directions in the case of the linear reciprocation and loading and unloading of wafers in the case of rotary motion.

There is a need in the art to coat webs or rolls or webs of substrate material with coatings that can be readily provided by existing ALD coating chemistries. Moreover it is desirable to apply such coatings at atmospheric pressure in order to avoid the high cost and complexity of coating substrates in a vacuum chamber and to avoid increased cycle times associated with loading substrates into and unloading substrates from a vacuum or sealed chamber. While Levy et al. disclose a system for ALD coating at atmospheric pressure, the system disclosed by Levy et al. requires a small separation distance (25 µm or less) between the substrate coating surface and the lower ends of the partitions used to form gas flow channels and a 25 µm, separation distance is impractical for many applications that require more variability in the separation distance. One problem is that the thickness of the some materials being coated can vary more than 25 µm. Another problem is that material stretching and position variations due to transport drive forces can cause the separation distance to vary more than 25 µm as the material is advanced past the gas distribution manifold. This is particularly problematic as web transport velocities reach 0.5 to 20 m/sec which is a velocity range enabled by systems and methods of the present invention. Accordingly there is a need in the art to provide systems and methods capable of delivering reliable coating ALD properties with a substrate to gas manifold separation distance in the range or 500 µm to 3 mm or more to accommodate variations in the separation distance due to variable material thickness and dynamic changes in separation distance due to material stretch and movement introduced by material transport mechanisms.

More generally, there is a need to increase ALD coating rates (e.g. as measured in square meters per minute). The present invention address this need by providing improved systems and method for ALD coating at atmospheric pressure thereby eliminating process chamber load and unload cycle times and pump down and purge cayle time associated with seal chambers used in conventional ALD coating systems. Additionally, the present invention increases coating rates per minute by optimizing unit cell dimensions and gas volume delivery to the substrate that provide complete saturation at desired substrate velocities.

Additionally there is a need to achieve faster saturation of substrate surfaces at increased substrate velocities. The present invention addresses this need by providing faster and more uniform process gas delivery and removal over substrate areas exposed to individual gas channels.

There is a further need to reduce the volume of chemistries used to achieve saturation of substrate surfaces being coated using ALD processes. The present invention addresses this need by reducing the volume of chemistries used during a first exposure by optimizing unit cell dimensions and gas volume delivery to the substrate according to desired substrate transport velocities and by providing an opportunity to reuse unreacted precursors by segregating and collecting dissimilar precursors removed during purge cycles. The reaction zone proximate to the substrate surface.

SUMMARY OF THE INVENTION

Methods and apparatus for depositing a layer on a coating surface are described herein.

In one aspect, a method of depositing a layer on a coating surface of a substrate is provided. The method comprises providing a deposition head including a unit cell having a first precursor nozzle assembly and a second precursor nozzle assembly; emitting a first precursor from the first precursor nozzle assembly into atmospheric conditions in a direction substantially normal to the coating surface; and, emitting a second precursor from the second precursor nozzle assembly into atmospheric conditions in a direction substantially normal to the coating surface. The method further comprises relatively moving the deposition head and the substrate such that the first precursor is directed onto a first area of the coating surface prior to the second precursor being directed onto the first area of the coating surface.

In one aspect, a deposition system is provided. The system comprises a substrate including a coating surface, and a deposition head including a unit cell having a first precursor nozzle assembly and a second precursor nozzle assembly. The first precursor nozzle assembly is constructed and arranged to emit a first precursor into atmospheric conditions in a direction substantially normal to the coating surface and the second precursor nozzle assembly is constructed and arranged to emit a second precursor into atmospheric conditions in a direction substantially normal to the coating surface. The system further comprises an actuator associated with the deposition head and/or the substrate. The actuator is configured to generate relative motion between the deposition head and the substrate for exposing a first area of the coating surface to the first precursor followed by exposing the first area of the coating surface to the second precursor.

In one aspect, a deposition head is provided. The deposition head comprises a plurality of first precursor nozzle assemblies; a plurality of second precursor nozzle assemblies; and, a plurality of inert gas nozzle assemblies respectively arranged between the first precursor nozzle assemblies and the second precursor nozzle assemblies. The deposition head further comprises a plurality of first exhaust channels arranged between the first precursor nozzle assemblies and the inert gas nozzle assemblies; and, a plurality of second exhaust channels arranged between the second precursor nozzle assemblies and the inert gas nozzle assemblies. The deposition head further comprises a first precursor delivery system for delivering first precursor to each of the plurality of first precursor nozzles; a second precursor delivery system for delivering second precursor to each of the plurality of second precursor nozzles; and, an inert gas delivery system for delivering inert gas to each of the plurality of inert gas nozzles. The deposition head further comprises an exhaust gas removal system for drawing exhaust gas through each of the first exhaust channels and each of the second exhaust channels and removing the exhaust gas from deposition head.

These and other aspects and advantages will become apparent when the Description below is read in conjunction with the accompanying Drawings.

BRIEF DESCRIPTION OF DRAWINGS

The features of the present invention will best be understood from a detailed description of the invention and a preferred embodiment thereof selected for the purposes of illustration and shown in the accompanying drawings in which.

CALLOUTS

Figure 1:
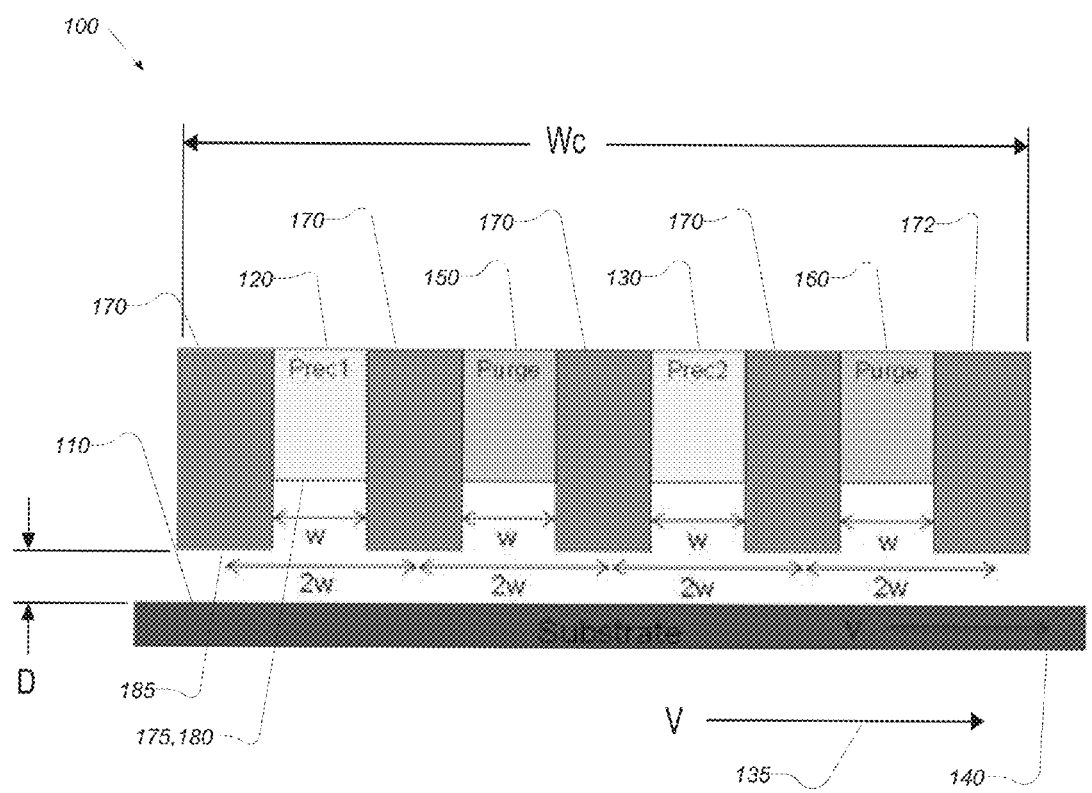
FIG. 1 illustrates a schematic side section view of a unit cell suitable for atmospheric ALD according to one example embodiment of the present invention.

| | | | |
|---|---|---|---|
| 100 | Unit cell | 1000 | Unit cell 1$^{st}$ embodiment |
| 110 | Coating surface | 1005A | First precursor nozzle assembly |
| 120 | 1$^{st}$ Precursor nozzle assembly | 1005B | Second precursor nozzle assembly |
| 130 | 2$^{nd}$ precursor nozzle assembly | 1010A | Exhaust inlet |
| 135 | Velocity vector | 1010B | Exhaust inlet |
| 140 | Substrate leading edge | 1010C | Exhaust inlet |
| 150 | 1$^{st}$ Purge nozzle assembly | 1015A | Purge nozzle assembly |
| 160 | 2$^{nd}$ Purge nozzle assembly | 1015B | Purge nozzle assembly |
| 170 | Spacer | 1025 | Substrate |
| 172 | End spacer | 1030 | Separation distance |
| 175 | Nozzle bottom edge | 1100 | Second Embodiment of the Gas Orifice Plate |
| 180 | Nozzle aperture | 1105 | Exhaust |
| 185 | Spacer bottom edge | 1110 | Precursor 1 Input |
| | | 1115 | Purge Gas Input |
| 200 | Unit cell | 1120 | Precursor 2 Input |
| 210 | Substrate | 1130 | Substrate |
| 220 | 1$^{st}$ Precursor nozzle | 1140 | 1$^{st}$ separation distance |
| 230 | 2$^{nd}$ Precursor nozzle | 1145 | 3$^{rd}$ separation distance |
| 250 | 1$^{st}$ Purge nozzle | 1150 | Base wall surface |
| 260 | 2$^{nd}$ Purge nozzle | 1155 | Vertical walls |

| | | | |
|---|---|---|---|
| 265 | Exhaust element | 1160A | Base wall |
| 280 | Exhaust channel | 1160B | Base wall |
| 285 | Exhaust channel | 1162 | Protruding wall |
| 290 | Flow channel | 1165 | Base wall |
| 292 | Nozzle aperture | 1170 | Gas orifice |
| 295 | Exhaust conduits | 1175 | $2^{nd}$ separation distance |
| 300 | Disposition head system | 1235A | Longitudinal Slot |
| 310 | Unit cell | 1235B | Longitudinal Slot |
| 320 | Unit cell | 1237 | Traverse Feed Slot |
| 330 | Unit cell | 1240 | Longitudinal Feed Slot |
| 340 | Unit cell | 1241 | Longitudinal Feed Slot |
| 360 | $1^{st}$ Precursor supply system | 1242 | Longitudinal Feed Slot |
| 370 | $2^{nd}$ Precursor supply system | 1300 | Exploded unit cell |
| 372 | End spacer | 1305 | Central wall |
| 380 | Inert gas supply system | 1310 | Longitudinal slot |
| 390 | End channel | 1315 | Longitudinal slot |
| | | 1320 | Orifice |
| 400 | Single nozzle assembly | 1325 | Orifice |
| 410 | Nozzle | 1330 | Longitudinal input slot |
| 420 | Spacer | 1335 | Precursor nozzle assembly |
| 430 | Spacer | 1340 | Precursor nozzle assembly |
| | | 1345 | Base wall |
| 500 | Insert | 1350 | Purge nozzle assembly |
| | | 1355 | Exhaust inlet |
| 700 | ALD Coating System | 1355A | Alternate exhaust inlet |
| 705 | Access Hatch | 1370 | Orifice |
| 710 | Gas Manifold | 1375 | Side walls |
| 715 | Removable Lid | 1400 | Gas control system |
| 720 | Various Access Ports | 1405 | Inert gas supply |
| 725 | Linear Bellows | 1410 | Pressure regulator |
| 730 | Motor Drive | 1412 | Input conduit |
| 735 | Linear Track | 1420 | Pressure regulator |
| 740 | Ball Screw Assembly | 1425 | Mass flow controller |
| 745 | ALD chamber enclosure | 1435 | Valve |
| | | 1440 | Valve |
| 805 | Precursor A Exhaust | 1445 | Valve |
| 810 | Precursor B Exhaust | 1450 | Bubblers |
| 815 | Precursor A Input | 1455 | Mass flow controller |
| 820 | Precursor B Input | 1460 | Gas manifold |
| 825 | Purge Gas Input | 1465 | Precursor exhaust line |
| 830 | Exhaust Collection Manifold B | 1470 | Precursor exhaust line |
| 835 | Exhaust Collection Manifold A | 1475 | Exhaust gas collection module |
| | | 1480 | Throttle Valve |
| 900 | Cross-section of Gas Manifold | 1485 | Blower |
| 910 | Exhaust gas A | | |
| 915 | Exhaust Collection Plate | 1500 | Deposition System |
| 920 | Exhaust Orifice Plate | 1510 | Unit Cell |
| 925 | Flow Distribution Plate | 1520 | Unit Cell |
| 930 | Precursor Orifice Plate | 1530 | Unit Cell |
| | | 1540 | Unit Cell |
| 1035 | Opposing Side Walls | 1550 | Supply Roll |
| 1040 | Hollow Chamber | 1560 | Take-up Roll |
| 1045 | Base Wall | 1570 | Substrate Support |
| 1050 | Bottom surface | 1580 | Drive Mechanism |
| 1055 | Hollow Chamber | 1585 | Gas Supply Module |
| 1060 | Longitudinal Slot Opening | 1590 | Exhaust Module |
| 1070 | Precursor orifices | | |
| | | 1600 | Deposition System |
| D | Separation distance | 1610 | Unit Cell |
| G | Film thickness growth | 1620 | Unit Cell |
| L | Unit cell longitudinal length | 1630 | Unit Cell |
| Tc | Cycle time | 1640 | Unit Cell |
| Td | Dwell time | 1650 | Supply Roll |
| Tm | Material layer thickness | 1660 | Take-Up Roll |
| V | Velocity | 1670 | Substrate Support |
| W | Nozzle width | 1680 | Drive Mechanism |
| Wc | Unit cell width | | |
| Wd | Deposition head width | | |
| Ws | Substrate width | | |

DESCRIPTION OF SOME EMBODIMENTS OF THE INVENTION

Figure 2:
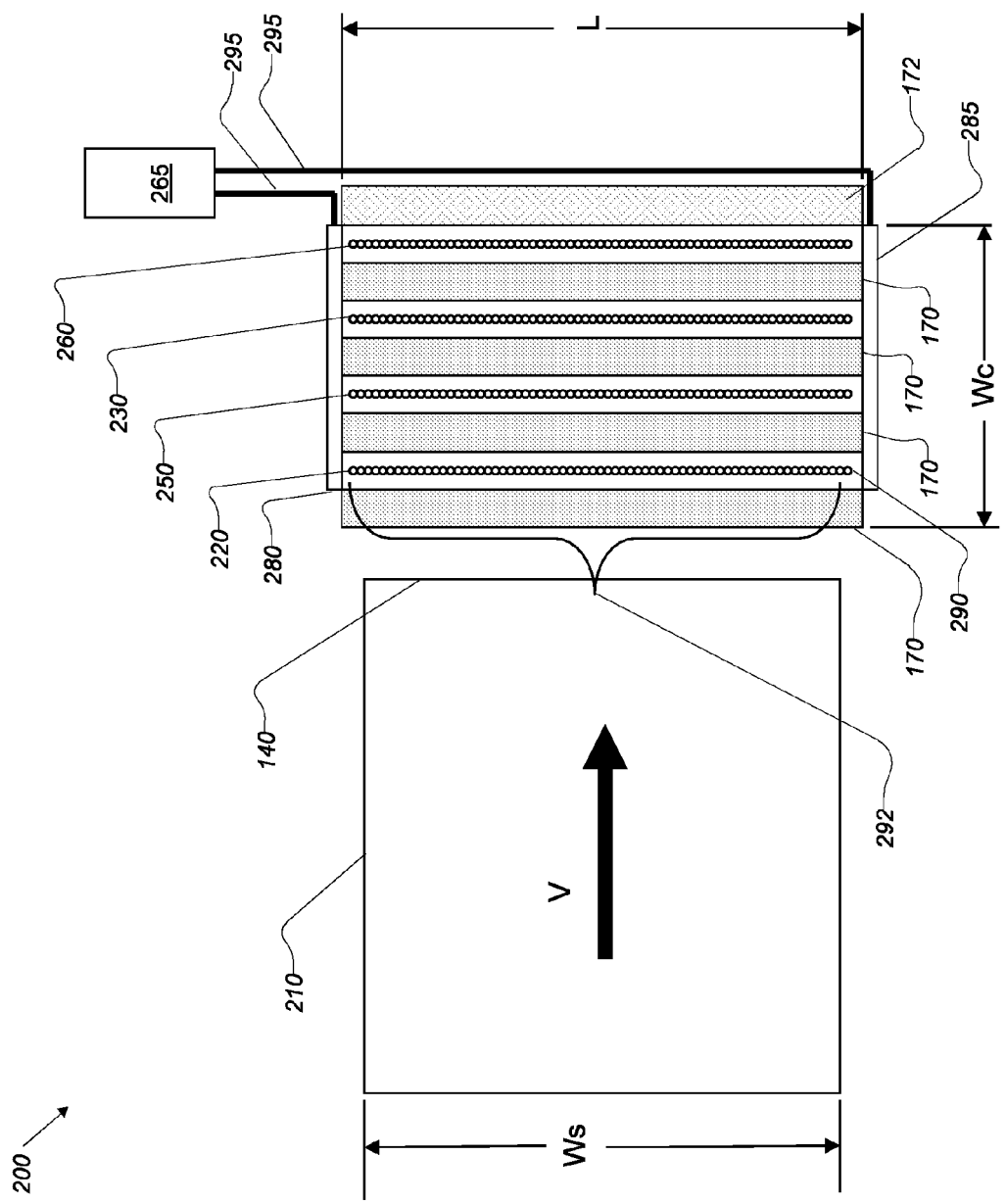
FIG. 2 illustrates a schematic bottom view of a gas deposition system that includes a moving substrate and a stationary single unit cell gas distribution manifold according to one example embodiment of the present invention.

Referring to FIGS. 1 and 2, a schematic section view of a unit cell (100), which forms a portion of a gas deposition head that preferably includes a plurality of unit cells. The unit cell is shown disposed above a solid substrate which includes a top surface or coating surface (110) which is the surface that is being coated by the unit cell (100). In the example embodiments described below the gas deposition process is atomic layer deposition, (ALD) process; however, the apparatus and methods disclosed herein can be used as is or adapted to perform other gas deposition processes such as forming a thin film coating onto the coating surface by directing a single gas or vapor precursor onto to the coating surface or such as forming a thin film coating onto the coatings surface by sequentially directing more than two dissimilar precursors onto the coating surface or such as forming a thin film coating by directing a mixture of two or more dissimilar gas or vapor precursor onto to the same region of the coating surface simultaneously.

The substrate may comprise any material suitable for being coated by an ALD process or by other gas and vapor deposition processes. Some non-limiting example substrate include metals, ceramics, plastics, semiconductors, dielectrics, woven fabrics, and organic materials such as wood, paper, and the like. The substrate may comprise a continuous web of solid material or one or more discrete elements. Preferably the unit cell (100) is stationary and the substrate is moved past the unit cell at a velocity (V); however the unit cell may be moved relative to a stationary substrate or substrates or both the substrate and unit cell may be moved.

The unit cell (100) has a width (Wc) and a longitudinal length (L) and the substrate has a width (Ws), both shown in FIG. 2. Preferably, the unit cell longitudinal length (L) substantially matches or exceeds the substrate width (Ws); however it may be desirable that the unit cell longitudinal length (L) is less than the substrate width (Ws) in some coating applications. The unit cell (100) and the coating surface (110) are disposed substantially parallel with each other at least over the width (Wc) of the unit cell and are separated by a separation distance (D).

The unit cell (100) includes a first precursor nozzle assembly (120) configured to direct a first gas precursor onto the coating surface (110). The unit cell (100) further includes a second precursor nozzle assembly (130) configured to direct a second gas precursor onto the surface (110). Preferably each of the first and second precursor nozzle assemblies (120, 130) is configured to direct precursor gas substantially normal to the surface (110) across the entire substrate width (Ws). Moreover it is preferable that each of the first and second precursor nozzle assemblies (120, 130) is configured direct a substantially uniform volume of precursor gas onto the surface (110) across the entire width (Ws).

Figure 3:
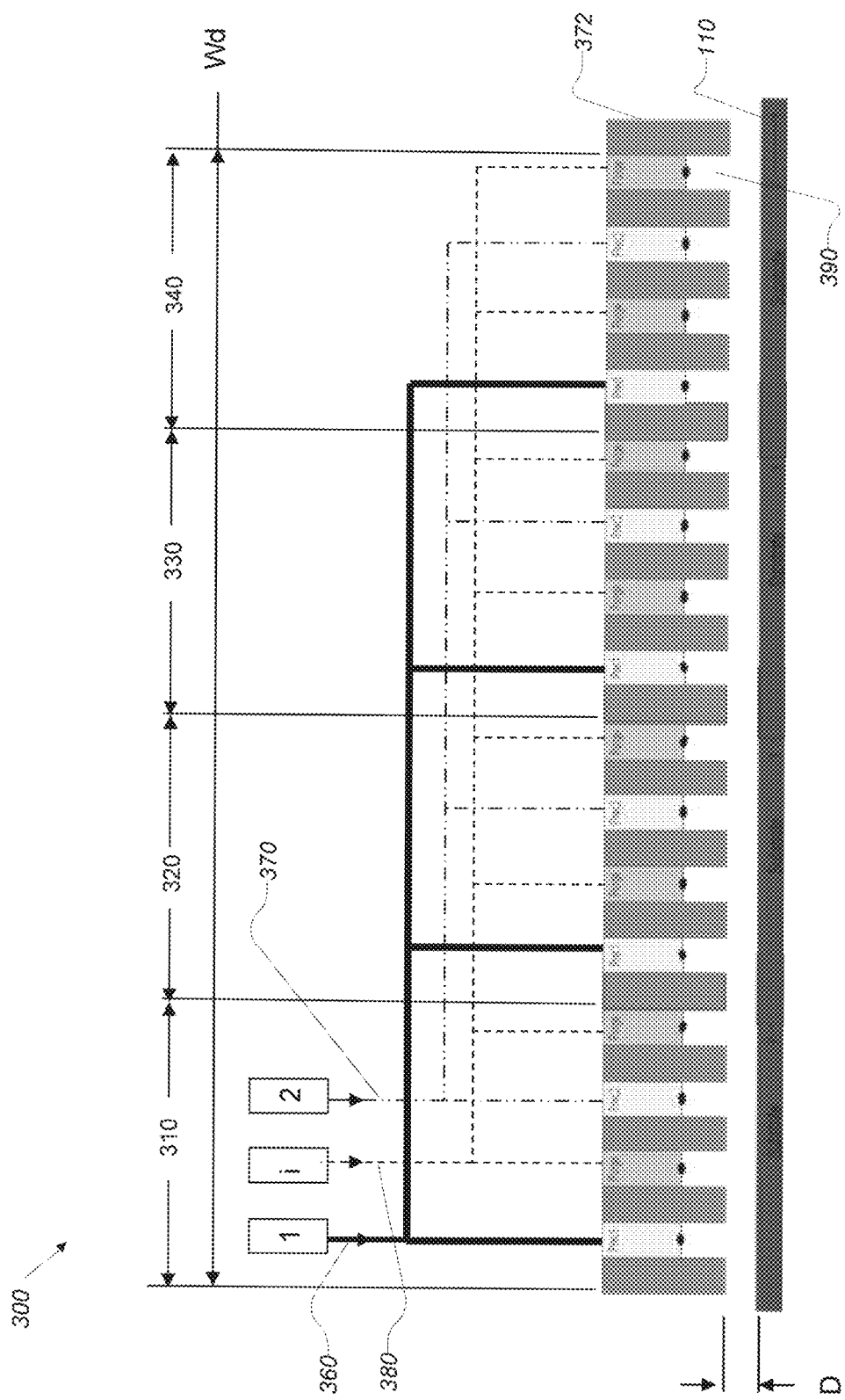
FIG. 3 illustrates a schematic side section view of a gas deposition manifold that includes four unit cells disposed over a moving substrate according to one example embodiment of the present invention.

Referring now to FIGS. 1-3, in a preferred embodiment, a unit cell is configured to operate using an ALD coating cycle. In operation, the coating surface (110) is advanced past the unit cell (100) at a velocity (V) in the direction indicated by the velocity vector (135) such that a substrate leading edge (140) advances past the first precursor nozzle assembly (120) before advancing past the second precursor nozzle assembly (130). Thus the coating surface leading edge (140) is first exposed to the first precursor exiting from the first precursor nozzle assembly (120) and thereafter exposed to the second precursor exiting from the second precursor nozzle assembly (130). The first and second precursor nozzle assemblies (120) and (130) each deliver a substantially continuous flow of precursor gas. As will be recognized by those skilled in the art, in an ALD reaction the first precursor reacts with the coating surface (110) and chemically alters the coating surface (110) prior to the coating surface (110) being exposed to the second precursor exiting from the second precursor nozzle (130). The chemically altered coating surface then reacts with the second precursor and the reaction with the second precursor forms a first solid material layer or thin film onto the coating surface (110). Thus the preferred unit cell (100) includes two precursor sources each disposed over a different area of the coating surface (110) such that the coating surface is sequentially exposed to the first precursor followed by being exposed to the second precursor and the two working in combination deposit a single solid material layer onto the coating surface (110) as the coating surface (110) is advanced past the unit cell. Alternately any combination of relative motion between the unit cell (100) and the coating surface (110) that advances the surface (110) first past the first precursor nozzle assembly (120) and then past the second precursor nozzle assembly (130) can be used to deposit the single solid material layer on the surface (110).

The unit cell (110) further includes a first inert gas or other suitable purge nozzle assembly (150) disposed between the first and second precursor nozzle assemblies (120) and (130) and a second inert gas or purge nozzle assembly (160) disposed adjacent to the second precursor nozzle assembly (130), e.g. between the second precursor nozzle assembly (130) and a first precursor nozzle assembly of an adjacent unit cell e.g. as shown in FIG. 3. Preferably each of the first and second purge nozzle assemblies (150, 160) is configured to direct inert gas substantially normal to the coating surface (110) across the entire substrate width (Ws). Moreover it is preferable that each of the first and second purge nozzle assemblies (150, 160) is configured to direct a substantially uniform volume of precursor gas onto the surface (110) across the entire width (Ws). Additionally it is preferred that the pressure and volume of inert gas delivered onto coating surface (110) by each of the purge nozzle assemblies (150, 160) exceed the pressure and volume of precursor delivered to the coating surface (110) by each of the precursor nozzle assemblies (120, 130) such that the inert gas directed onto the coating surface tends confine precursor gas flow proximate to the coating surface to the region between adjacent purge nozzle assemblies (150, 160).

The inert gas directed onto the surface (110) by the inert gas nozzle assemblies serves two purposes. The first purpose is to form an inert gas buffer zone disposed between the first and second precursors proximate to the coating surface (110). The inert gas buffer zone substantially confines precursor gas proximate to the coating surface (110) to a longitudinal zone disposed along the entire longitudinal dimension (L) of the unit cell (100) thereby providing an inert gas buffer zone that prevents the first and second precursors from mixing proximate to the coating surface (110). Additionally, the continuous flow of inert gas being directed onto the coating surface (110) by the purge nozzle assemblies (150, 160) serves to continuously purge unreacted precursor and reaction byproducts generated by the reactions between the first and second precursors and the coating surface (110). More specifically, the leading edge (140) passes the first precursor nozzle assembly (120) which exposes the leading edge to first precursor resulting in a chemical reaction between the first precursor and the coating surface (110) and immediately thereafter the leading edge (140) passes the first inert gas nozzle assembly (150), which purges any reaction byproducts and or unreacted first precursor from the leading edge (140) before the leading edge (140) reaches the second precursor nozzle assembly (130). Similarly, the leading edge (140) passes the second precursor nozzle assembly (130) which causes a chemical reaction between the second precursor and the coating surface (110) and immediately thereafter the leading edge (140) passes the second inert gas nozzle assembly (160), which purges any reaction byproducts and or unreacted second precursor from the leading edge (140) before the leading edge (140) reaches the end of the unit cell. Thus the unit cell (100) operates as a continuous ALD material layer forming device that simultaneously directs the first precursor onto the coating surface (110), while continuously purging any unreacted first precursor and reaction byproducts from the coating surface (110) with the first inert gas nozzle assembly (150), while simultaneously directing the second precursor onto the coating surface (110) and continuously purging any unreacted first precursor and byproducts from the coating surface (110) with the second inert gas nozzle assembly (160). Preferably, the unit cell (100) and coating surface (110) are substantially at atmospheric pressure in order to avoid the expense, complexity and throughput reductions associated with performing ALD processes in a vacuum chamber. Moreover, the process of simultaneously applying first and second precursors while simultaneously purging reaction byproducts from different regions of the coating surface as the coating surface (110) advances past the unit cell reduces coating cycle times as compared to ALD processes carried out in a reaction chamber maintained at a vacuum pressure or low pressure that requires sealing the chamber during coating cycles since according to the present invention the precursor applications and purging cycles are carried out simultaneously instead of sequentially as is generally the case in a reaction chamber.

Figure 10:
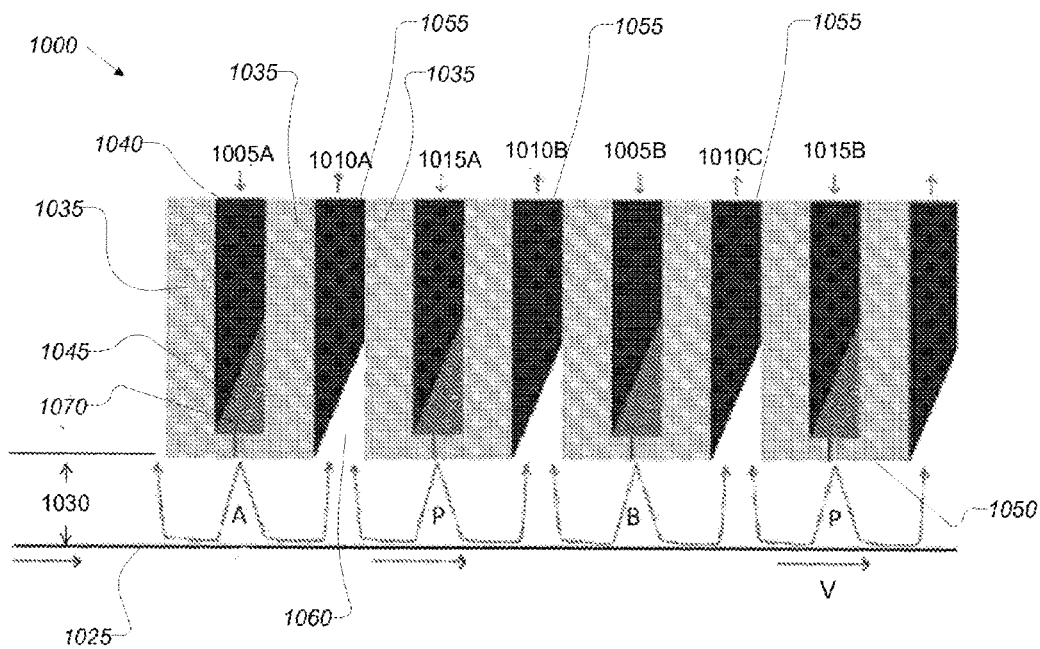
FIG. 10 illustrates an isometric section view of a unit cell of a precursor a precursor orifice plate according to an embodiment of the present invention.

The unit cell (100) includes spacers (170) or is formed with integral spacing separating the nozzle assemblies (120, 150, 130, and 160) and further includes an end spacer (172) for spacing adjacent unit cells apart from each other. Each nozzle assembly comprising interconnected elements or a unitary plate or bar structure that include a nozzle bottom edge (175) and one or more nozzle apertures (180) for emitting gasses out therefrom. Generally each nozzle aperture is in fluid communication with a gas source and a gas feed system forces an appropriate gas or vapor to be expelled through the nozzle aperture and directed onto the coating surface. The nozzle assemblies each further include spacer(s) (170) which may comprise walls or partitions disposed between adjacent nozzle apertures (such as 120 and 150). In the longitudinal axis as shown in FIG. 2, each nozzle assembly comprises a row of nozzle apertures and each spacers comprises a sold wall or partition that extends continuously along the entire longitudinal length (L) of the unit cell (100). In some embodiments the nozzle aperture(s) may be substantially coplanar with the spacer bottom edge (175) such as is shown in FIG. 10, or the nozzle apertures (120, 150, 130, 160) may be recessed from the bottom edge (175) e.g. shown in FIG. 11, such that the spacers or separators form longitudinal flow channels (290) that confine gas flow exiting from the row of nozzles apertures to a volume defined by corresponding longitudinal flow channel (290) formed by the spacers or separators. The spacer bottom edges (175) are spaced away from the coating surface (110) by a separation distance (D), which may range from substantially zero to about 5 mm but which is preferably between 0.5 and 3 mm. In the example of FIG. 1, each nozzle assembly (120, 150, 130, and 160) and each spacer (170, 172) has the same width dimension (w). In other embodiments, the width dimensions of nozzles and spacers may be non-uniform and may be varied in a manner that produces desired gas flow patterns.

Referring now to FIG. 2, a unit cell (200) and substrate (210) are shown in a bottom view. The unit cell (200) has a cell width (Wc) extending substantially along the axis of the substrate velocity vector (V). The unit cell (200) has a longitudinal cell length (L) that is substantially perpendicular to the cell width (Wc). The substrate (210) may comprise a material web having a substantially unlimited length along the velocity axis (V) or the substrate (210) may comprise a plurality of discreet substrates supported on a transport surface such as a moving web configured to transport a plurality of discreet substrates supported thereon past the unit cell (200) at a velocity (V). The substrate (210) has a substrate width (Ws). Preferably, the unit cell length (L) matches or exceeds the substrate width (Ws). However the cell length (L) vs. substrate width (Ws) may be adapted according to particular coating applications including coating less than the entire width (Ws) of the substrate.

Figure 11:
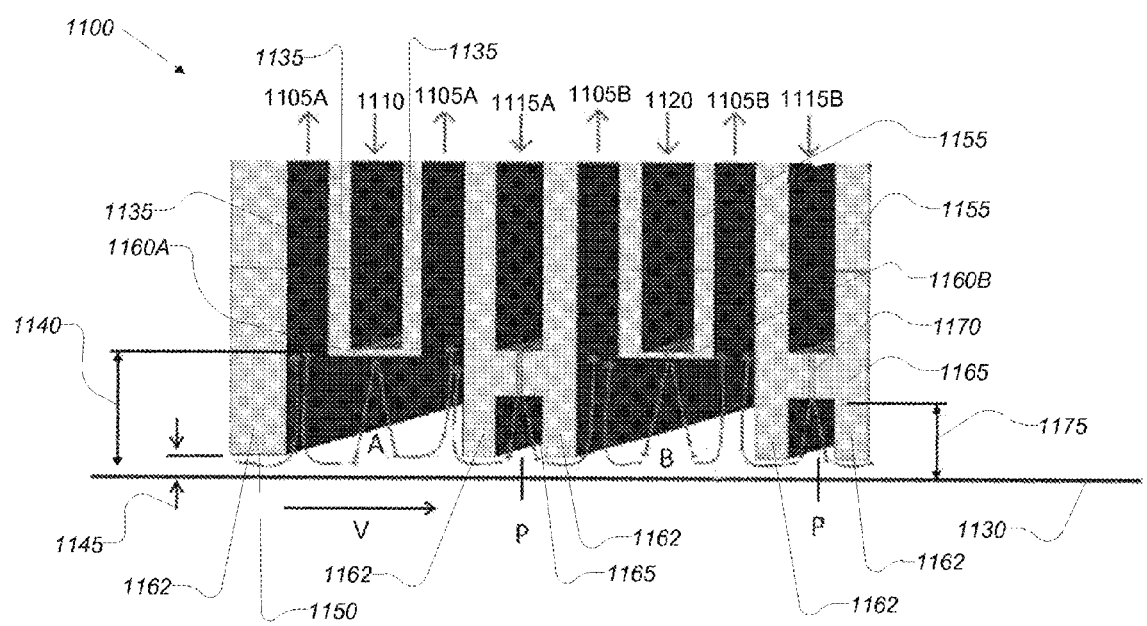
FIG. 11 illustrates an isometric section view of a unit cell of a precursor orifice plate according to another embodiment of the present invention

The unit cell (200) includes a plurality of nozzle assemblies including a first precursor nozzle assembly (220), a second precursor nozzle assembly (230) and two inert gas or purge nozzle assemblies (250) and (260). As described above, a plurality of spacers or separators (170, 172) are disposed between the nozzle assemblies to separate the nozzle assemblies from one another and in some cases (as shown in FIG. 11) to define longitudinal gas flow channels (290) extending along the cell length (L). Each gas flow channel (290) may also fluidly interconnect with one or more exhaust channels or plenums (280) and (285). In the example embodiment, the exhaust channels or plenums (280, 285) are disposed at opposing ends of each of the flow channels (290) extending along the velocity axis and one or both exhaust channels (280, 285) is in fluid communication with a volume that extends between the unit cell and the coating surface defined by the separation distance (D). The exhaust channels are also in fluid communication with an exhaust element (265), such as a vacuum pump or fan, via exhaust conduits (295). The exhaust element (265) operates continuously to remove gas from the exhaust channels (280, 285) such that gas is continuously removed from the volume that extends between the unit cell and the coating surface defined by the separation distance (D). In the case when the unit cell (200) comprises a substantially planar bottom surface, e.g. when the nozzle apertures are flush with the spacer bottom edges (175), the separation distance (D) is substantially uniform over the entire processes area and the exhaust channels (280, 285) may be positioned and configured to remove gas substantially uniformly along the entire unit cell width (Wc). In other cases where the nozzle apertures are recessed from the spacer bottom edges, the separation distance (D) is not uniform, the exhaust channels may be positioned and configured to remove gas substantially from each of the longitudinal flow channels (290). In either case, the exhaust element (265) operates continuously to remove gas from the exhaust channels (280, 285). In addition, the exhaust channels (280, 285) of the unit cell (200) may be configured to fluidly communicate with the exhaust channels of adjacent unit cells when several unit cells are assembled together to form a deposition head such as the deposition head system (300) shown in FIG. 3.

In a further embodiment of the unit cell (200) gas flow in the purge nozzle assemblies (250, 260) is directed along the longitudinal axis (L) or parallel to the coating surface (110) instead of directed onto the coating surface with normal incidence as described above. In this embodiment of the unit cell (200) purge gas flows parallel to the coating surface and sweeps any unreacted precursor and reaction byproduct from the coating surface toward one or both of the exhaust channels (280) and (285). The outflow from the exhaust channels is then carried to the exhaust element (265) and vented or otherwise processed. In this embodiment, only the purge nozzle assemblies (220) and (230) are in fluid communication with the exhaust channels (280) and (285) such that gas flow in the precursor nozzle assemblies (220) and (230) does not enter the exhaust channels (280) and (285) but is instead drawn toward the purge nozzle assemblies and swept to the exhaust channels by the longitudinal flow in each purge nozzle assembly. It is also noted that the gas flow in alternating purge nozzle assemblies may be in same direction or in opposite direction or the purge gas may enter each purge nozzle assembly at the center of the longitudinal axis and flow in opposite directs from the center to each of the opposing exhaust channels (280) and (285).

As further shown in FIG. 2, each nozzle assembly (220, 250, 230, and 260) includes a plurality of nozzle aperture (292) through which gas is expelled under pressure. The nozzle assembly may comprise a plurality of closely spaced circular holes or other aperture shapes or one or more longitudinal slots disposed along the longitudinal length (L) with each circular hole or slot in fluid communication with an appropriate feed plenum. In either case appropriate gases or vapors are directed onto the coating surface substantially along the entire longitudinal length (L) and the number of and shape of the nozzle apertures are optimized to provide a substantially uniform gas volume being expelled out of each nozzle aperture (292). Thus the coating surface is simultaneously exposed to a substantially uniform volume of process or inert gas along its entire longitudinal length (L) to promote uniform coating over the substrate width (Ws). Preferably each nozzle assembly (220, 250, 230, and 260) emits a substantially continuous flow of gas and each of the exhaust channels operates continuously to withdraw a substantially continuous flow of gas from the volume between the unit cell and the substrate or from the purge nozzle assemblies as may be the case.

Referring now to FIG. 3 a non-limiting embodiment of a gas deposition head system (300) includes four unit cells (310, 320, 330, 340) assembled together in an area array with each unit cell positioned at a distance (D) above a substrate coating surface (110). Each unit cell (310, 320, 330, and 340) is configured sustainably as shown in FIG. 1 except only the end unit cell (340) includes an end spacer (372) for forming an end channel (390). Each unit cell (310, 320, 330, and 340) receives a supply of the first precursor gas from a first precursor supply system (360) and delivers a volume of first precursor to each of four first precursor nozzle assemblies. Similarly a second precursor supply assembly (370) delivers a volume of second precursor to each of four second precursor nozzle assemblies and an inert gas supply system (380) delivers a volume of inert gas to each of eight purge gas nozzle assemblies. Each gas supply system (360, 370, 380) may include a gas supply container (1, i, 2), a gas flow regulator, not shown, for regulating gas pressure and or mass flow rate and heating elements, not shown, for heating the precursors to a desired reaction temperature. Additionally, the system (300) may include a substrate transport system, not shown, an electronic controller, not shown, and various sensor and feedback circuits, not shown, for sensing and controlling temperature, gas pressure and mass flow rate, substrate transport velocity, thin film coating thickness, and other properties as may be required.

The example deposition head system (300) includes four unit cells (310, 320, 330, and 340) assembled together with unit cell widths (Wc) extending along the velocity axis such that the example head system (300) is configured to deposit four material layers onto the substrate surface (110) during one pass of the substrate over the assemble width (Wd). In the example embodiment (300), all four material layers being deposited onto the substrate surface (110) are substantially identical material layers with the composition and thickness of each material layer being substantially uniform and dependent on the composition of the first and second precursors applied to the coating surface (110). Ideally, the precursors and the coating surface (110) are maintained at a reaction temperature suitable for the desired reaction and the reaction temperature may range from 20.degree. C. to 600.degree. C. depending upon the precursor and substrate materials. In other example embodiments, one or more of the unit cells may be fed by a different combination of precursors such that the deposition head system (300) may be configured to coat the coating surface (110) with solid material layers having different material compositions and or material thicknesses without deviating from the present invention. In further example embodiments, one or more of the precursor nozzle assemblies may include plasma or other high energy sources suitable for ionizing particles of a gas precursor.

Figure 4:
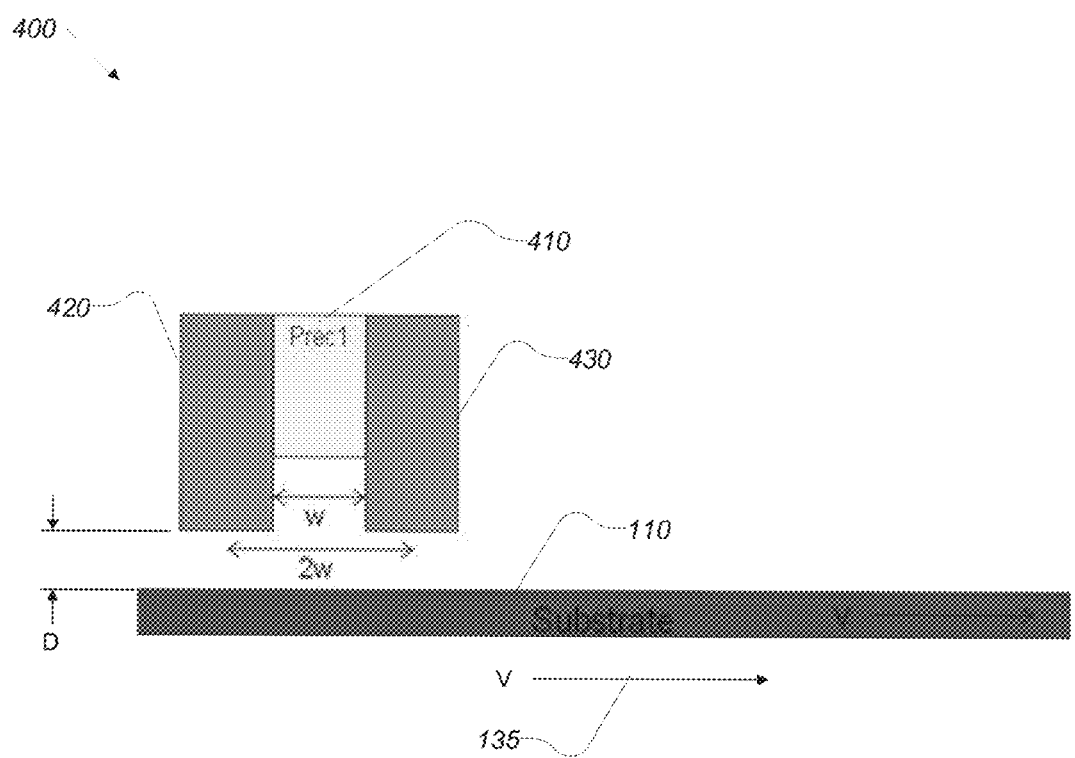
FIG. 4 illustrates a schematic side section view of a single gas nozzle and associated spacers suitable for atmospheric ALD coating of a moving substrate according one example embodiment of the present invention.

Referring now to FIG. 4, a single nozzle assembly (400) includes a nozzle assembly (410) and its surrounding spacers (420) and (430). The nozzle assembly (400) may comprise any gas nozzle assembly of the unit cell (100). In the example embodiment of the nozzle assembly (400), the nozzle aperture area (410) and each of the spacers (420, 430) have the same width (w); however other configurations are usable without deviating from the present invention. When the coating surface (110) advances past the nozzle assembly (410) at a velocity (V) the time duration that a portion of the coating surface (110) is passing under a nozzle is called a Dwell Time (td) is given by:

$$\text{Dwell Time } t_d = 2w/V \quad [1]$$

Ideally, the dwell time is equal to the duration required for complete saturation of the area of the substrate surface that passes the nozzle during the dwell time. More specifically complete saturation occurs when substantially every molecule of the coating surface that is available to react with a molecule of the precursor completes a reaction. Thus an ideal velocity (V) is one that if increased would cause less than complete saturation of the area of the substrate surface that passes the nozzle assemble width ($2w$) during the dwell time. Other variables that influence the level of saturation include the nozzle width w, the volume of precursor that is available to react with the coating surface (110), the precursor and substrate temperature, the precursor pressure, gas turbulence proximate to the coating surface and the precursor gas concentration in the region proximate to the coating surface. Similarly it is preferred that each precursor nozzle assembly (410) and associated spacers (420) and (430) are configured to provide substantially uniform precursor availability and reaction conditions proximate to the substrate surface (110) across the entire unit cell longitudinal length (L) to ensure that complete saturation occurs over the entire substrate width (Ws).

Referring now to FIG. 1, in one non-limiting example embodiment, a unit cell (100) includes a plurality of equal width precursor nozzle assemblies (120) and (130), purge nozzle assemblies (150) and (160) and equal width spacers (170, 172) and a substrate coating surface (110) advancing past the unit cell (100) at a velocity (V). Using the Dwell Time of equation 1, the Cycle Time ($t_c$) required for the unit cell (100) to perform a single ALD cycle, i.e. to deposit a single material layer on to the surface (110) is given as:

$$\text{Cycle Time } t_c = t_{prec1} + t_{purge} + t_{prec\ 2} + t_{purge} = 8w/V \quad [2]$$

In the example embodiment shown in FIG. 3 wherein a plurality of unit cells is assembled together, the width (Wd) of the deposition head (300) is the combined width of (N) unit cells (100) and is given by:

$$\text{Deposition head width } Wd = N(8w) \quad [3]$$

With each unit cell (310, 320, 330, 340) contributing a film thickness growth (G), the total material layer thickness (Tm) applied by a deposition head of width (Wd), is given by:

$$\text{Material layer thickness } Tm = NG = (Wc/8w)G \quad [4]$$

Dwell Time and Substrate Velocity

Figure 5:
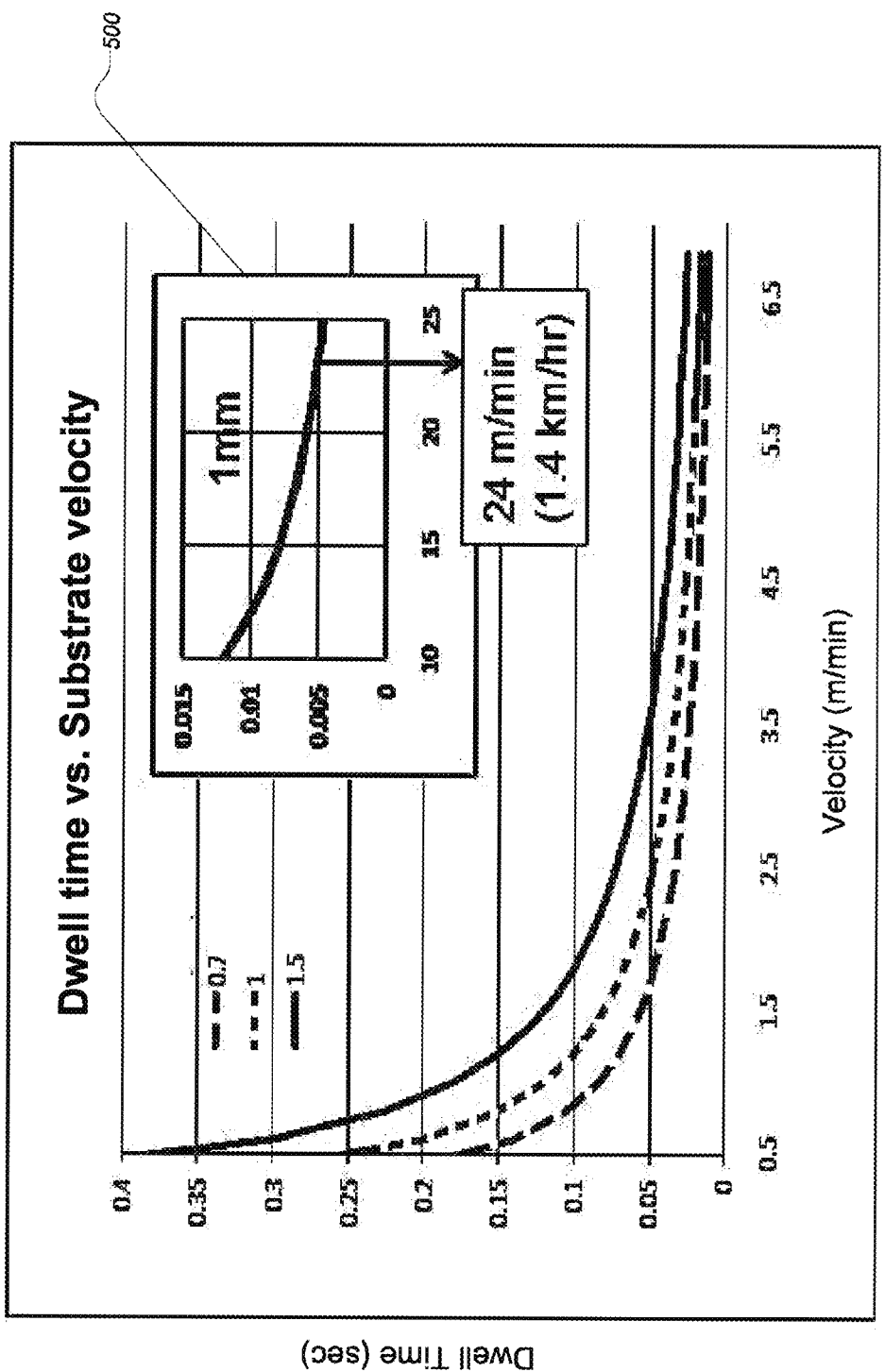
FIG. 5 illustrates a graphical plot of dwell time in seconds vs. substrate linear velocity in meters per minute for three different nozzle widths according to one aspect of the present invention.

Referring now to FIG. 5, characteristic times and dimensions associated with depositing films using the deposition head system (300) are shown graphically. Specifically FIG. 5 plots Dwell Time (td) in seconds as a function of the substrate velocity for 3 different channel widths (w) ranging from 0.7-1.5 mm. As further shown in the insert (500) equations 2-4 above indicate the ability to obtain material coating speeds of 24 m/min for a dwell time of 5 ms corresponding to a 1 mm channel width.

Example 1

To understand key aspects of the dwell time more clearly, it is instructive to consider the traditional deposition of an ALD film such as Al.sub.2O.sub.3. Deposition of Al.sub.2O.sub.3 begins with the use of a first precursor comprising Trimethylaluminum (TMA) and a second precursor comprising water (H.sub.2O). In a traditional ALD vacuum reactor, such as the SAVANNAH ALD system available from Cambridge Nanotech Inc. of Cambridge Mass. based on previous deposition research experience we have estimated that a dwell time of 0.5 ms under atmospheric conditions will replicate the conditions seen for simple saturation of the precursor on the substrate under vacuum conditions. Therefore dwell times of the precursor of 5 msec under atmospheric conditions (which is a factor of 100.times. greater than required for simple saturation), should provide sufficient saturation even at speeds in excess of 20 m/min.

Channel Width and Substrate Velocity

Figure 6:
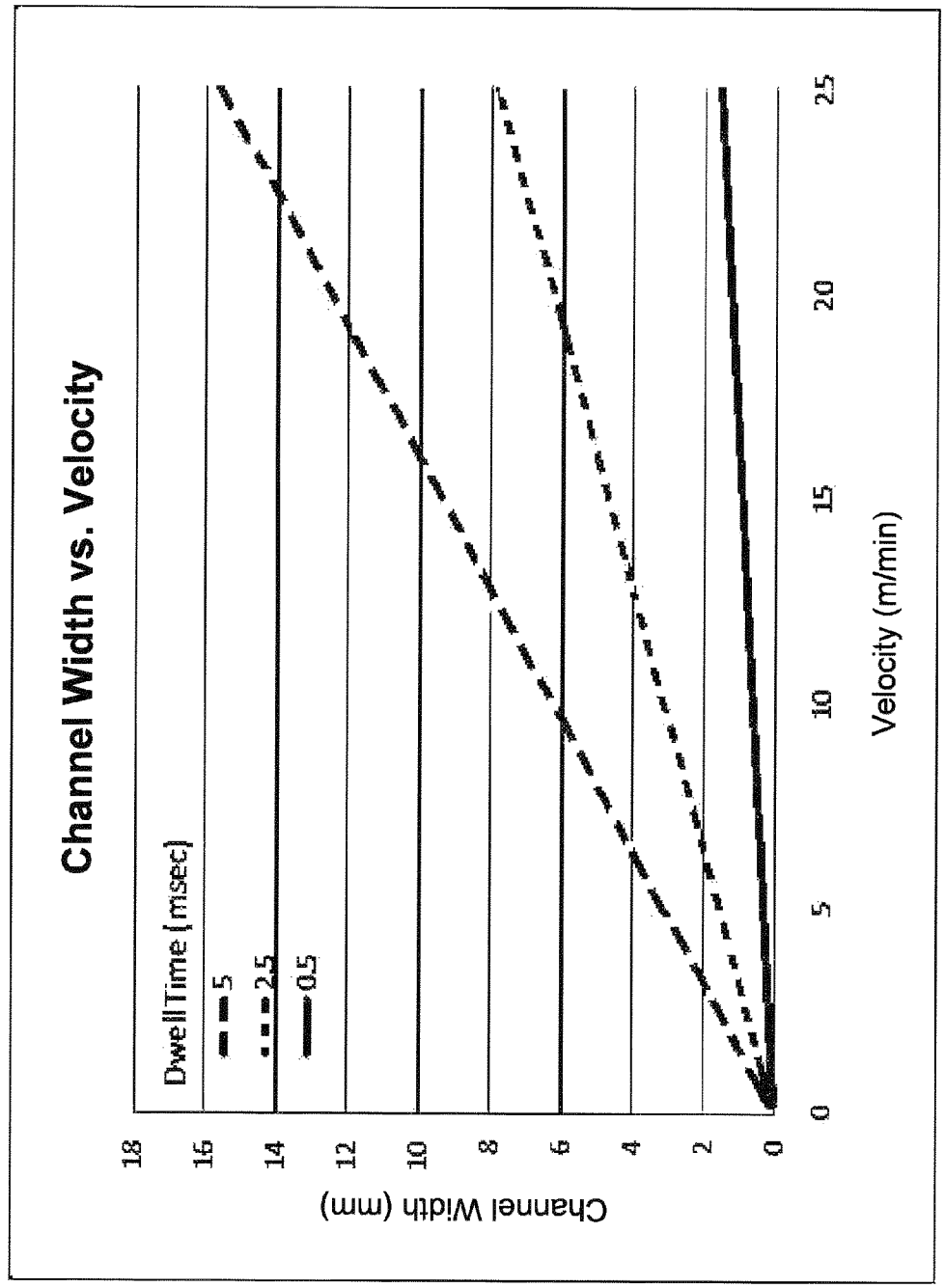
FIG. 6 illustrates a graphical plot of channel width in millimeters vs. substrate velocity in meters per minute for three dwell times in milliseconds according to one aspect of the present invention.

Referring now to FIG. 6, the relationship between channel width and substrate velocity is shown graphically. Specifically FIG. 6 plots channel width (w) vs. substrate velocity (V) for various dwell times (td). The plot generally shows that larger channel widths allow for greater substrate velocities at more relaxed dwell times, however, larger channel widths can lead to impractical sizes for the deposition heads especially when a large total film thicknesses (i.e. a large number of unit cells) is required. However the plot further shows that the use of shorter dwell times allows the channel width to be reduced.

More specifically, FIG. 6 plots channel width (w) vs. substrate velocity (V) for three dwell times (td) of 5.0, 2.5, and 0.5 ms. Each curve describes the change in channel width required to maintain a fixed dwell time as the substrate velocity increases. The results indicate that to achieve processing speeds on the order of 20 msec, the channel width needs to be maintained at approximately 1 mm, so that practical full cell sizes can be maintained for thicker films.

More specifically one non-limiting embodiment of the present invention comprises a deposition system (300) constructed to operate with a dwell time ranging from 0.1-5 ms, a 0.1-10 mm channel width and a substrate velocity ranging from 0.5 to 20 msec.

Example Gas Manifold and Linear Transport Device

Figure 7:
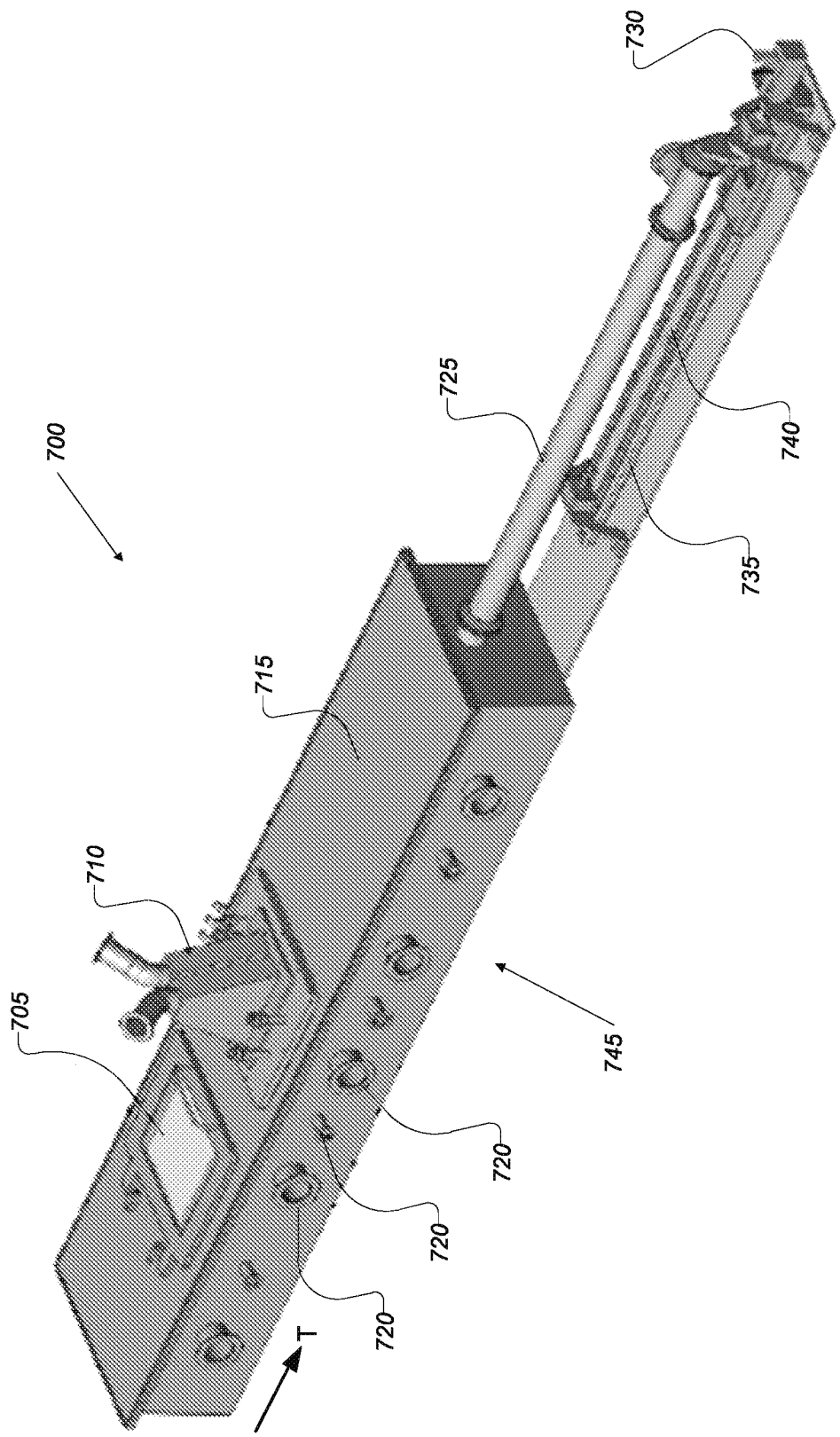
FIG. 7 illustrates an isometric view of a gas distribution manifold supported over a substrate linear transport mechanism suitable for performing the ALD coating cycles according to one aspect of the present invention.

Referring to FIG. 7, a non-limiting example ALD coating system (700) comprises a gas manifold (710) fixedly attached to an ALD chamber enclosure (745) and associated linear transport elements. The enclosure (745) includes a linear displacement mechanism housed therein with drive elements extending out therefrom. The linear displacement mechanism is configured to support a substrate or substrates being coated on the linear displacement mechanism which transports the substrates(s) passed the fixed gas manifold (710). The ALD chamber enclosure (745) is configured to load the substrate(s) being coated onto the linear displacement mechanism through an access hatch (705), which provides access into the ALD chamber (745).

The gas manifold (710) is adapted to deliver ALD precursors into the ALD chamber and to direct the ALD precursors onto a coating surface of various substrate(s) as the substrate(s) are transported past the gas manifold (710). The gas manifold (710) is further adapted to isolate precursors from each other at the coating surface using inert gas separation zones, described above, to purge unreacted precursor gases and reaction byproduct away from the coating surfaces, and to exhaust the unused precursor gases, reaction byproduct and inert gas to an exhaust area external to the gas manifold (710) and ALD chamber enclosure (745).

The chamber enclosure (745) is formed with various access ports (720) passing through side walls of the chamber enclosure (745). The access ports include gas and electrical fittings and connectors and the like to connect gas input and output conduits to the access ports (720), and to connect gauges, sensors, control devices, heaters, or other electrical devices to the access ports for use inside the ALD chamber as may be required. The top of the ALD chamber may have a removable lid (715). Preferably the ALD chamber is maintained substantially at atmospheric pressure and may be vented to atmosphere by a vent port, fan or the like. Alternately the ALD chamber may be slightly pressurized, e.g. 1.1 times atmospheric pressure, by pumping an inert gas flow into the ALD chamber enclosure (745) through an access port (720) such that gasses inside the ALD chamber tend to exit the ALD chamber through exit conduits provided in the gas manifold (710).

In the present non-limiting example embodiment, the linear displacement mechanism comprises a mechanical linear displacement system comprising a ball screw assembly (740), linear track (735), motor drive or drive coupling (730), and linear bellows (725), and the transport direction is along the longitudinal axis of the linear bellows (725). While such a system is convenient for evaluating the performance of the ALD coating system (700), in further embodiments, the gas manifold (710) may be disposed over a conveyer system, e.g. a conveyer belt, or the like, that continuously advances a plurality of discrete substrates supported on a conveyer belt past the gas manifold (710). As with the system (700), the continuous web transports substrates past the manifold (710) along a transport axis substantially defined by the longitudinal axis of the linear bellows (725). In a further embodiments, the gas manifold (710) may be disposed over a web of substrate material that is transported past the gas manifold such that the entire web of material is coated with one or more thin film layers as precursors exiting from the gas manifold react with a coating surface of the web of substrate material.

In addition, ALD coating system (100) interfaces with an electronic controller, not shown, which at least includes a precision linear transport drive system and linear position feedback system for operating the motor drive (730), or the like, at various speeds to maintain one or more substantially constant linear velocities of the substrate being coated as it passes the gas manifold (710). Additionally, the electronic controller interfaces with elements of a gas flow control system shown in FIG. 7 and various other electric elements associated with operating and evaluating the performance of the system (700).

Example Gas Manifolds

Figure 8:
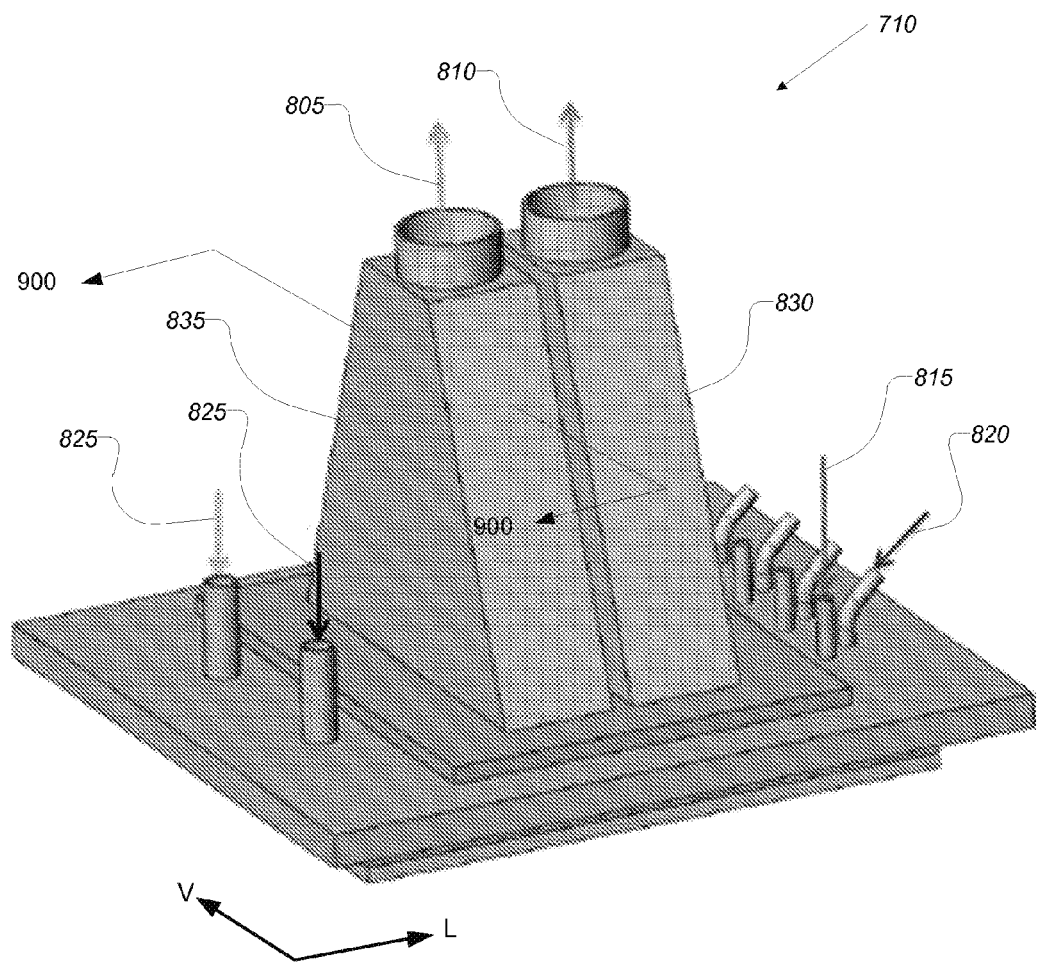
FIG. 8 illustrates an isometric view of the gas distribution manifold according to the present invention.

Referring to FIGS. 7-14, a non-limiting example gas manifold (710) according to the present invention is configured to direct precursor gas flows onto substrate coating surface(s) as the coating surface(s) advance past a precursor orifice plate (930). Additionally gas manifold (710) is configured to direct inert gas flows onto the coating surface(s) between precursor gas flows in a manner that prevents dissimilar precursors from mixing. Furthermore gas manifold (710) is configured to draw gas flows away from coating surface(s) and remove exhaust gases from the gas manifold (710). As depicted in FIG. 8 the gas manifold (710) includes a plurality of input ports for receiving different precursors therein. One or more input ports (815) receive a supply of a first gas or vapor precursor A from a first precursor source and one or more input ports (820) receive a supply of a second gas or vapor precursor B from a second precursor source. In addition, the gas manifold (710) includes one or more input conduits (825) each in fluid communication with an inert gas source such as a nitrogen based gas, neon gas, argon gas, xenon gas, helium gas or a combination thereof. In addition, the gas manifold (710) includes one or more output or exhaust conduits (805, 810) which may be connected to one or more outflow depositories for collecting and in some embodiments processing the exhaust gases.

As best viewed in FIGS. 9-14 exhaust gases are collected from the coating surface(s) through a plurality of exhaust inlets (1010A, 1010B, 1105A, 1105B) passing through the precursor orifice plate (930). Exhaust gasses collected by exhaust inlets are conveyed to the exhaust collection manifolds (830) and (835) by exhaust flow channels that extend from the exhaust inlets through each of the plates (925), (920) and (915). The exhaust gases comprise a mixture of unreacted precursor, reaction byproduct and inert gas. In a preferred embodiment, exhaust gases are segregated according to which unreacted precursor they contain. More specifically, according to one aspect of the present invention, the gas manifold (710) is configured to exhaust gasses that contain unreacted precursor A and unreacted precursor B in separate segregated exhaust flow channels. First exhaust flow channels are arranged to convey exhaust gasses that contain unreacted precursor A to a first exhaust collection manifold (835) which includes an exhaust port (805). Similarly second exhaust flow channels are arranged to convey exhaust gasses that contain unreacted precursor B to a second exhaust collection manifold (830) which includes an exhaust port (810). Each of the exhaust ports (805) and (810) are in fluid communication with a blower (1485) which operates to draw the exhaust gases out of the exhaust ports (805) and (810) and deliver exhaust gases removed from the gas manifold to an exhaust gas collection module (1475). Preferably, exhaust gas collection module (1475) comprises two separate chambers or channels for collecting and segregating the outflow from the exhaust port (805) from the outflow from the exhaust port (810) so the each outflow can be further processed to separately reclaim unreacted precursors A and B for reuse. In various embodiments a single blower (1485) may be used to draw exhaust gas out of both exhaust collection manifolds (835) and (830) or each exhaust collection manifold may be in fluid communication with a separate blower (1485). In further embodiments, the gas manifold (710) may be configured to combine the entire exhaust gas outflow into a single exhaust manifold e.g. by combining the exhaust manifolds (830) are (835) into a single exhaust manifold. In addition to removing exhaust gases from one or both of the exhaust gas manifolds (830) and (835) the blower or blowers (1475) operate to lower gas pressure in each of the exhaust gas manifolds which acts to draw gas away from the coating surface through the plurality of exhaust inlets (1010A, 1010B, 1105A, 1105B) passing through the precursor orifice plate (930). By comparison with the unit cell (100) shown in FIG. 1, the exhaust inlets (1010A, 1010B, 1105A, 1105B) are disposed in the locations of the spacers (170, 172).

As best viewed in FIGS. 9-13, process gases enter and flow through the gas manifold (710) as follows. Precursor A enters through one or more precursor A input ports (815), and is conveyed to the substrate coating surface through first precursor flow channels that are dedicated to conveying precursor A exclusively. Similarly Precursor B enters through one or more precursor B input ports (820) and is conveyed to the substrate coating surface through second precursor flow channels that are dedicated to conveying precursor B exclusively. Similarly purge gas enters through one or more purge gas input ports (825) and is conveyed to the substrate coating surface through purge gas flow channels that are dedicated to conveying purge gas exclusively. Each of the first and second precursor channels and the purge gas channel pass through the precursor orifice plate (930) and through each of the plates (925), (920) and (915).

A bottom face of the gas manifold (710) is formed by the precursor orifice plate (930). The bottom face is preferably square or rectangular having a longitudinal dimension (Lh) extending along the longitudinal axis (L) and a transverse dimension (Wc) extending substantially perpendicular to the longitudinal dimension (Lh) along the velocity axis (V) which is the axis defined by the substrate velocity. In various embodiments the precursor orifice place (930) may be configured to apply gas deposition layers over a process area having a longitudinal dimension ranging from 4 to 36 inches and a transverse dimension ranging from 0.2 to 36 inches. The skilled artisan will recognize other functioning dimensions and shapes for the precursor orifice plate's (930) bottom face and process area are included in the scope of the present invention. More generally, the gas manifold (710) is configured with its longitudinal dimension (Lh) matched to or exceeding a width dimension (Ws) of a substrate coating surface and with its transverse dimension or head width (Wc) corresponding with the number of unit cells contained in the gas manifold (710), e.g. as set forth in equation 3 above. As noted above, the head width (Wc) comprises some multiple of width of a single unit cell, (e.g. 100), wherein each unit cell deposits a single thin film material layer onto the coating surface. Thus the head width (Wc) is ultimately a function of the desired total film thickness being applied which is equal to the product of the thickness applied per unit cell and the number of unit cells. While the longitudinal dimension (Lh) or coating width of the gas manifold (710) is generally fixed, the skilled artisan with readily recognize that a plurality of gas manifolds (710) can be joined together or individually disposed side by side along the (V) axis to increase the desired total film thickness wherein each gas manifold (710) applies additional thin film layers to a substrate being transported thereunder. More generally, a single gas manifold (710) is configurable with the longitudinal dimension (L) and transverse dimension (Wd) of the precursor orifice plate (930) adapted to optimize the coating width and number of thin film layers being deposited per pass for a particular purpose. It is also noted that substrates may be cycled through a plurality of passes under the same gas manifold (710), e.g. by a reciprocating linear motion to achieve greater total material thicknesses. It is also noted that the coating area of the gas distribution manifold can be matched to a particular non-web substrate (e.g. a large television screen) for coating the large non-web substrate using a reciprocating motion of either the gas distribution manifold or the substrate or both.

Example Precursor Orifice Plates

Referring now to FIG. 10, a schematic section view taken through a single unit cell (1000) of a first embodiment of the gas orifice plate (930) illustrates a first gas orifice plate design and gas flow patterns. While the entire gas orifice plate (930) may comprise a single unit cell (1000), the gas orifice plate (930) is preferably configured as a unitary plate that includes a plurality of unit cells (1000) disposed side by side and extending along its transverse dimension (Wd) along the velocity axis (V). As detailed above, each unit cell (1000) deposits a single ALD coating layer or thin film onto a coating surface being transported past the unit cell. In FIG. 10, a substrate (1025) is transported past the unit cell (1000) along the velocity axis (V) and is spaced apart from a base surface of the unit cell by a separation distance (1030), which may have a dimension between 0.5 and 5 mm with a preferred separation distance range of 0.5 to 2 mm. The substrate coating surface faces the unit cell (1000) and is preferably coplanar with the unit cell base surface (1050). In a preferred embodiment the separation distance (1030) is at least 0.5 mm to provide sufficient clearance between the base surface (1050) and the coating surface to accommodate variation in the substrate thickness as well as any undesirable fluctuations in the position of the substrate as it is transported past the gas manifold. Additionally the minimum separation distance of 0.5 mm provides enough clearance between the bottom surface (1050) and the coating surface for gas exiting from the precursor and purge nozzle assemblies to leak under the base surface (1050) to be drawn into the exhaust inlets and removed from the region proximate to the coating surface. The minimum separation distance of the present invention of 0.5 mm is much larger than the operating separation distance of 0.025 mm disclosed in the prior art by Levy et al., which is not practical for coating moving webs or for coating substrates supported on a moving web.

The unit cell (1000) includes two precursor nozzle assemblies (1005A, 1005B), for directing precursors (A and B) onto the coating surface. The unit cell includes two inert gas or purge nozzle assemblies (1015A, 1015B) for directing an inert or purge gas, (e.g. nitrogen) onto the coating surface, and each purge nozzle assembly is disposed between two precursor nozzle assemblies. The unit cell (1000) includes three exhaust inlets (1010A, 1010B, 1010C) each comprising a longitudinal slot (1060) that passes vertically through the precursor orifice plate (930). Each exhaust inlet is in fluid communication with appropriate exhaust flow passages that pass vertically through the flow distribution plate (925), the exhaust orifice plate (920) and the exhaust collection plate (915) to one of the exhaust collection manifolds (830) or (835). Each exhaust inlet (1010A, 1010B, 1010C) extends substantially over the entire longitudinal dimension of the precursor orifice plate (930) and withdraws gas from the separation distance (1030). Each exhaust inlet is disposed between a precursor nozzle assembly (1005A, 1005B) and a purge nozzle assembly (1015). Note also that the precursor nozzle assembly (1005A) has an exhaust inlet and a purge nozzle assembly disposed to its left when another unit cell is placed adjacent to the unit cell (1000) on its left edge.

As the substrate coating surface advances past the unit cell (1000) it first passes the first precursor nozzle assembly (1005A) which directs precursor A onto the coating surface. Precursor A reacts with the coating surface changing the chemical and physical properties of the coating surface and producing a reaction byproduct. Unreacted precursor A, reaction byproduct and inert gas expelled from the purge nozzle assembly (1015A) mix together in the separation distance (1030) proximate to precursor nozzle assembly (1005A) and the gas mixture of unreacted precursor A, inert gas and reaction byproduct associated with the reaction of precursor A with the coating surface is substantially completely drawn into the first exhaust inlet (1010A) as the coating surface is advanced past the exhaust inlet (1010A). Additionally the curtain of inert gas expelled by each purge nozzle assembly tends to prevent the unreacted precursor A and reaction byproduct for flowing or diffusing parallel to the coating surface toward other precursor nozzle assemblies before it is drawn into the exhaust inlet (1010A). Note that another exhaust port, e.g. of an adjacent unit cell not shown, may be positioned adjacent to the precursor nozzle assembly (1005A) opposed to exhaust inlet (1010A) such that two exhaust inlets surround the precursor nozzle assembly (1005A) to continuously withdraw gases from the separation distance (1030).

The substrate coating surface then advances past the purge nozzle assembly (1015A) which directs inert gas onto the coating surface. The inert gas flow provides an inert gas curtain extending along the longitudinal axis (L) that segregates precursor A from precursor B in the separation distance (1030), which is large enough to allow unreacted precursor and reaction byproduct to be drawn into exhaust inlets but small enough that gas diffusion to neighboring precursor nozzle assemblies is prevented. In addition the inert gas flow from the purge nozzle assemblies (1015A) tends purge the coating surface as it passes under the purge nozzle assemblies (1015A) and continues to purge the separation distance (1030) of any additional unreacted precursor A and reaction byproduct. Meanwhile, gasses are continuously withdrawn from the coating surface and separation distance (1030) proximate to the purge nozzle assembly (1015A) by each of the exhaust inlets (1010A) and (1010B).

The coating surface then advances past the second precursor nozzle assembly (1005B) which directs precursor B onto the coating surface. Precursor B reacts with the coating surface after it has been altered by the reaction with precursor A, and the reaction between precursor B and the coating surface deposits a new thin film layer onto the coating surface while also producing another reaction byproduct. Unreacted precursor B, reaction byproduct from the reaction of precursor B with the coating surface and inert gas expelled from the first and second purge nozzle assemblies (1015A, 1015B) mix together in the separation distance (1030) proximate to the precursor nozzle assembly (1005B) and are drawn into the second and third exhaust inlets (1010B and 1010C). The coating surface finally advances past the second purge nozzle assembly (1015B) which directs inert gas onto the coating surface to segregate precursor A from precursor B and push waste gas toward the exhaust inlet (1010C). Note that another exhaust inlet, e.g. of an adjacent unit cell not shown, may be positioned adjacent to the purge nozzle assembly (1015B) opposed to exhaust inlet (1010C) such that two exhaust inlets surround the purge nozzle assembly (1015B) to continuously draw gases from the separation distance (1030). In addition the inert gas flow from the purge nozzle assembly (1015A) further purges the coating surface as it passes the port (1015B) and continues to purge the separation distance (1030) of any unreacted precursor B and reaction byproduct.

Referring to FIG. 11, a second embodiment of a precursor orifice plate (930) includes a unit cell (1100). In this embodiment the unit cell (1100) has three separation distances. A first separation distance (1140) extends between bottom surfaces of each of the precursor nozzle assembly base walls (1160A) and (1160B) and the coating surface and the first separation distance (1140) may have a dimension in a range of 4-10 mm. A second separation distance (1175) extends between bottom surfaces of each of the purge nozzle assembly base walls (1165) and the coating surface and the second separation distance may have a dimension in the range of 2-8 mm. A third separation distance (1145) extends between a precursor orifice plate base surface (1150) and the coating surface and the third separation distance may have a dimension in the range of 0.5 to 3 mm. In a preferred embodiment the third separation distance (1145) is at least 0.5 mm to provide sufficient clearance between the base surface (1150) and the coating surface to accommodate variation in the substrate thickness as well as any undesirable fluctuations in the position of the substrate as it is transported past the base surface (1150). Additionally the minimum separation distance of 0.5 mm provides enough clearance between the bottom surface (1150) and the coating surface for gas exiting from the purge nozzle assemblies to leak under the base surface (1150) for being drawn into the exhaust inlets and removed from the region proximate to the coating surface.

Generally the second separation distance (1175) is larger than the third separation distance (1145) and the first separation distance (1140) is larger than the second separation distance (1175); however in some embodiments the first and second separation distances (1140) and (1175) may be substantially equal with both being greater than the third separation distance (1145). In this embodiment, the purge nozzle assemblies (1115A and 1115B) include a base wall (1165) with its bottom surface defining the second separation distance (1175) and opposing parallel walls (1162) that extend vertically downward to meet the base surface (1150). The walls (1162) separate the purge nozzle assemblies (1115A and 1115B) from adjacent exhaust inlets (1105A and 1105B) and convey purge gas exiting from the purge gas nozzle assemblies toward the coating surface while preventing the purge gas from being drawn into the adjacent exhaust inlets (1105A and 1105B) until it is proximate to the coating surface, e.g. 0.5 to 2 mm from the coating surface. Moreover, the walls (1162) provide a mechanical barrier for helping to prevent precursor A expelled from the precursor nozzle assembly (1110) from mixing with precursor B expelled from the precursor nozzle assembly (1120). In this embodiment, each precursor nozzle assembly (1110) and (1120) includes a base wall (1160A and 1160B) with its bottom surface defining the third separation distance (1140). Each precursor nozzle assembly (1110) and (1120) is bounded by opposing side walls (1162) which help to covey precursor to the coating surface and prevent the precursor from diffusing past the purge gas nozzle assemblies.

The unit cell (1100) includes a first precursor nozzle assembly (1110) for directing precursor A onto the coating surface (1130) and two opposing exhaust inlets (1105A) disposed one on each side of the first precursor nozzle assembly (1110) for collecting exhaust gas from the coating surface and from the volume bounded by each of the separation distances (1140) and (1145). The exhaust gas collected by the two exhaust inlets (1105A) includes unreacted precursor A, reaction byproduct and inert gas. Similarly the unit cell (1100) includes a second precursor nozzle assembly (1120) for directing precursor B onto the coating surface (1130) and two opposing exhaust inlets (1105B) disposed one on each side of the second precursor nozzle assembly (1120) for collecting exhaust gas from the coating surface and from the volume bounded by each of the separation distances (1140) and (1145). The exhaust gas collected by the two exhaust inlets (1105B) includes unreacted precursor B, reaction byproduct and inert gas. Each of the four exhaust inlets (1105A and 1105B) pass through the precursor orifice plate (930) and are in fluid communication with flow channels passing through the flow distribution plate (925), the exhaust orifice plate (920) and the exhaust collection plate (915) which delivers waste gas into one of the exhaust gas manifolds (830) or (835) and the blower (1485) withdraws outflow from each of the exhaust collection manifolds (830) and (835). According to one aspect of the present invention, exhaust gas collected by exhaust inlets (1105A) is segregated from exhaust gas collected from exhaust inlets (1105B) such that only exhaust gas that includes unreacted precursor A exits from the exhaust collection manifold (805) and only exhaust gas that includes unreacted precursor B exit from the exhaust collection manifold (810).

The unit cell (1100) further includes a first purge nozzle assembly (1115A) disposed between the first precursor nozzle assembly (1110) and the second precursor nozzle assembly (1120) and a second purge nozzle assembly (1115B). Each purge nozzle assembly (1115A, 1115B) directs inert gas onto the coating surface between opposing walls (1162) and the inert gas leaks under the walls (1162) through the third separation distance (1145) to prevent precursor A from mixing with precursor B. In a preferred embodiment the gas pressure and or gas volume expelled from each of the purge nozzle assemblies (1115A, 1115B) may be greater than the gas pressure and volume expelled from each of the precursor nozzle assemblies (1110, 1120) to ensure that precursor gas and or reaction byproduct do not leak under the protruding walls (1162).

As the substrate (1130) advances past the unit cell (1100) it first passes the first precursor nozzle assembly (1110) which directs precursor A onto the coating surface. Precursor A reacts with the coating surface changing the chemical and physical properties of the coating surface and produces a reaction byproduct. Unreacted precursor A, the reaction byproduct and inert gas expelled from the first purge nozzle assembly (1115A) mix together proximate to the coating surface and in the volumes defined by the separation dimensions (1145) and (1140). The mixture is withdrawn from the volumes defined by the separation dimensions (1145) and (1140) and from the coating surface by the two exhaust inlets (1105A) disposed one on each side of the first precursor nozzle assembly (1110). Each of the exhaust inlets (1105A) removes unreacted precursor A, reaction byproduct and inert gas without mixing unreacted precursor B with the exhaust gases. The substrate then advances past the purge nozzle assembly (1115A) which directs inert gas onto the coating surface to further purge any reaction byproduct or unreacted precursor A from the coating surface. As described above, the inert gas expelled onto the coating surface forms a gas curtain that extends from the base wall (1165) to the coating surface and segregates precursor A from precursor B.

The substrate (1130) then advances past the second precursor nozzle assembly (1120) which directs precursor B onto the coating surface. Precursor B reacts with the coating surface after it has been altered by the reaction with precursor A, and the reaction of precursor B with the chemically and physically altered coating surface deposits a thin solid film layer onto the coating surface while also producing another reaction byproduct. Unreacted precursor B, the reaction byproduct and inert gas expelled from purge nozzle assemblies (1115A and 1115B) mix together at the coating surface. The mixture is withdrawn from the volume defined by the separation distances (1140 and 1145) and from the coating surface by the exhaust inlets (1105B) disposed one on each side of second precursor nozzle assembly (1120). The substrate then advances past the purge nozzle assembly (1115B) which directs inert gas onto the coating surface. The inert gas expelled onto the coating surface forms a gas curtain that extends between the base walls (1165) and the coating surface and segregates precursor B from precursor A and further removes reaction byproducts and unreacted precursor B from the coating surface.

Precursor and Inert Gas Delivery

Figure 12:
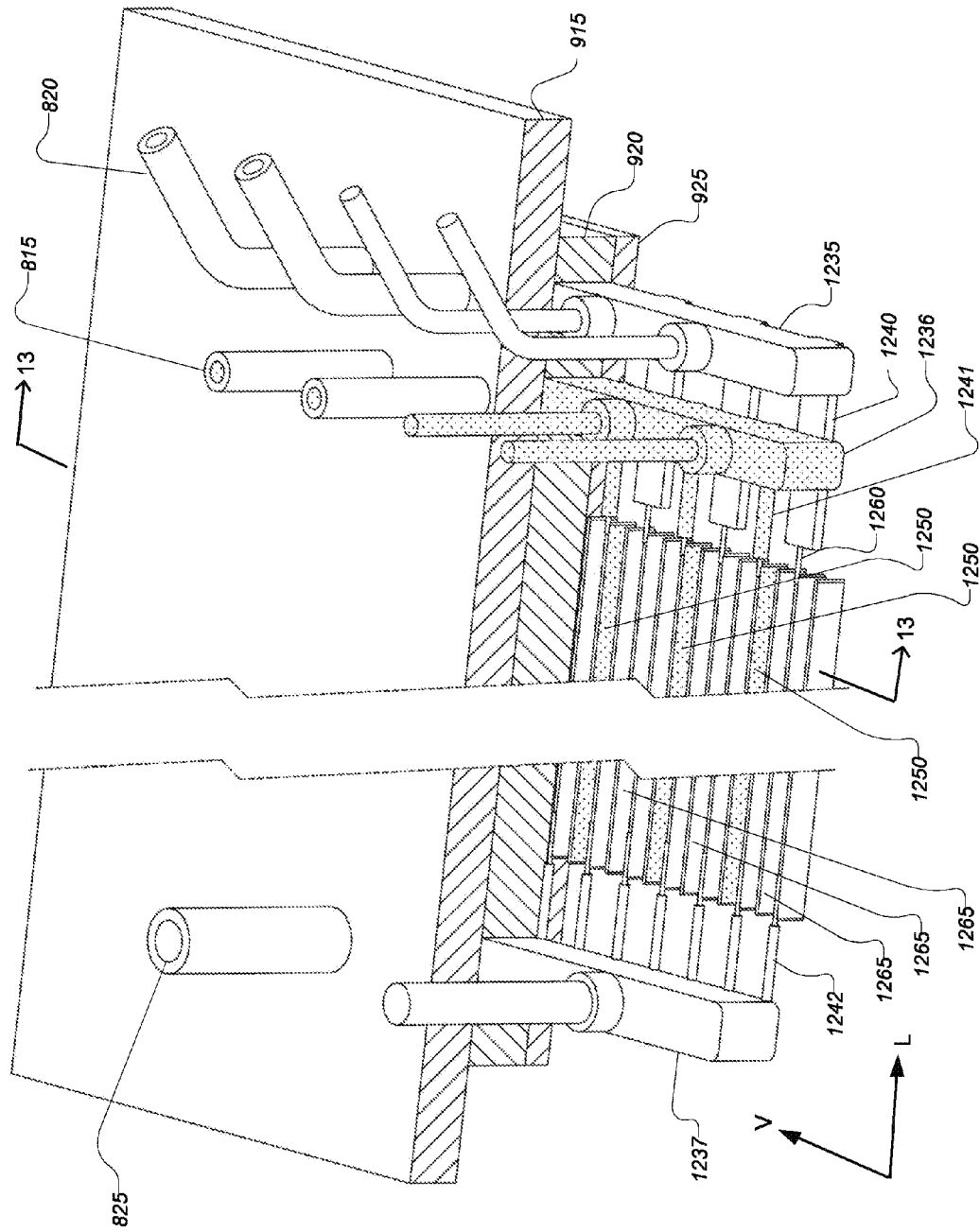
FIG. 12 illustrates an isometric section view of a gas distribution manifold illustrating input gas flow according to one aspect of the present invention.

Referring to FIG. 12, the gas manifold (710) is shown partially cut away in a top isometric split view which depicts hardware in a rear portion of the figure and gas flow in a front portion of the figure to illustrate precursor flow through the gas manifold (710). The flow path of precursor A is patterned for clarity. FIG. 12 depicts a section view taken through the exhaust collection plate (915), the exhaust orifice plate (920) and the flow distribution plate (925). The precursor orifice plate (930) is not shown in FIG. 12. Precursor A enters the gas manifold (910) through a plurality of precursor ports (815). Precursor ports (815) pass through the exhaust collection plate (915) and deliver precursor A into a first transverse fluid conduit formed in the exhaust orifice plate (920). Item (1236) comprises precursor A as it would appear passing through the first transverse conduit. Precursor A exits the transverse conduit via a plurality of longitudinal flow paths (1241) which are formed by a plurality of first longitudinal fluid conduits formed in the flow distribution plate (925). Each of the plurality of flow paths (1241) feeds a first precursor nozzle assembly, such as (1005A or 1110) detailed above, and gas flow through a plurality of first precursor nozzle assemblies is shown as (1250) in FIG. 12.

Precursor B enters the gas manifold (910) through a plurality precursor ports (820). Precursor ports (820) pass through the exhaust collection plate (915) and deliver precursor B into a second transverse fluid conduit formed in the exhaust orifice plate (920). Item (1235) comprises precursor B as it would appear passing through passing through the second transverse conduit formed in the exhaust orifice plate (920). Precursor B exits the second transverse conduit via a plurality of second longitudinal flow paths (1240) which are formed by a plurality of second longitudinal fluid conduits in the flow distribution plate (925). Each of the plurality of flow paths (1240) feeds a second precursor nozzle assembly, such as (1005B or 1120) detailed above, and gas flow through a plurality of second precursor nozzle assemblies is shown as (1265) in FIG. 12.

As further shown in FIG. 12, inert gas enters into the manifold through inert gas ports (825). The a plurality of inert gas ports pass through the exhaust collection plate (915) and deliver inert gas flow into a third transverse fluid conduit formed in the exhaust orifice plate (920). Item (1237) comprises inert gas as it would appear passing through the third transverse conduit formed in the exhaust orifice plate (920). Purge gas exits the third transverse conduit via a plurality of third longitudinal flow paths (1242) which are formed by a plurality of third longitudinal fluid conduits in the flow distribution plate (925). Each of the plurality of flow paths (1242) feeds a purge nozzle assembly, such as (1015A, 1015B or 1115A and 1115B) detailed above, and purge gas flows through a plurality of purge nozzle assemblies extending longitudinally from each of the flow paths (1242).

Exhaust Gas Removal

Figure 9:
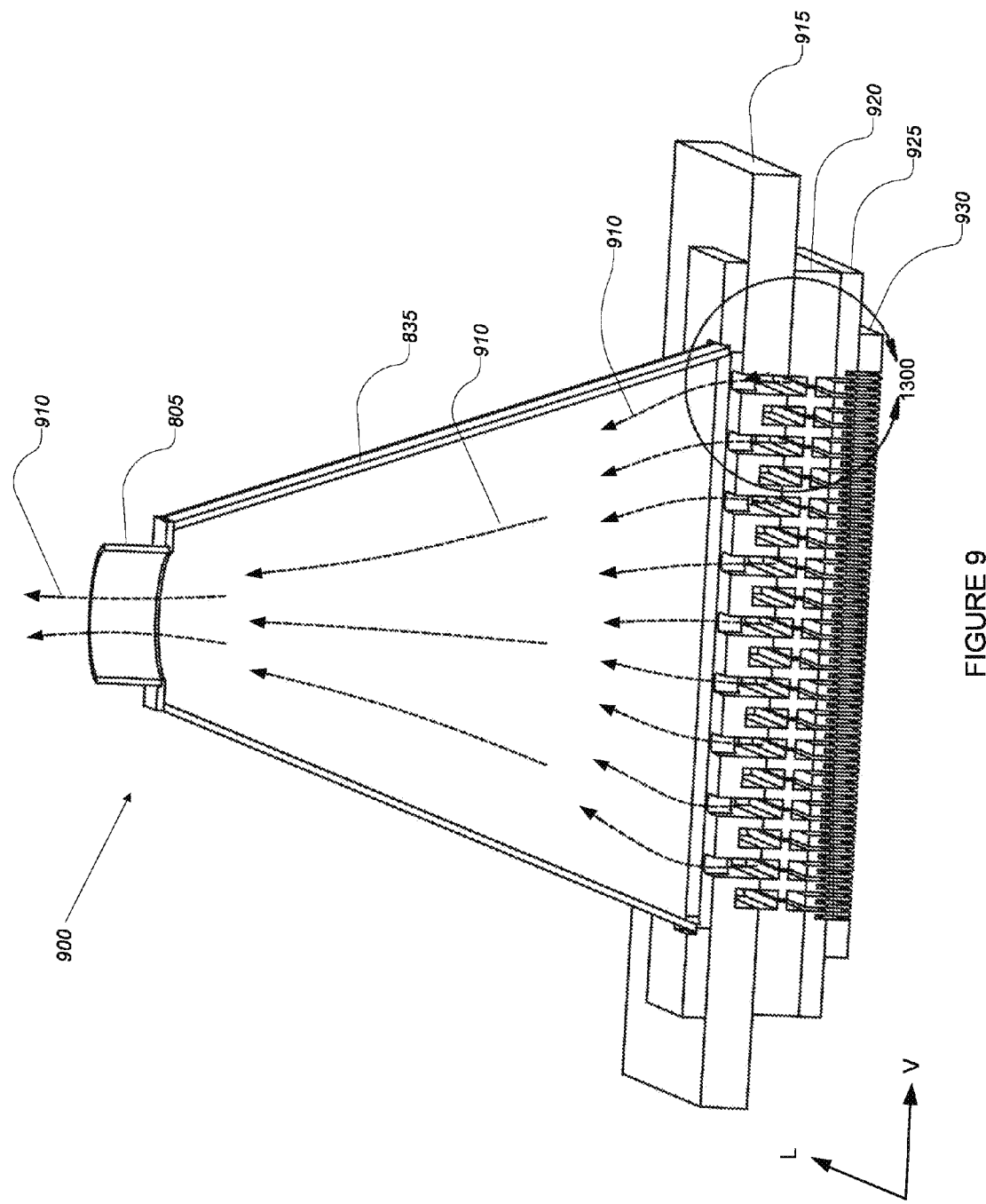
FIG. 9 illustrates a cross-section in isometric view of a gas distribution manifold according to the present invention.
Figure 13:
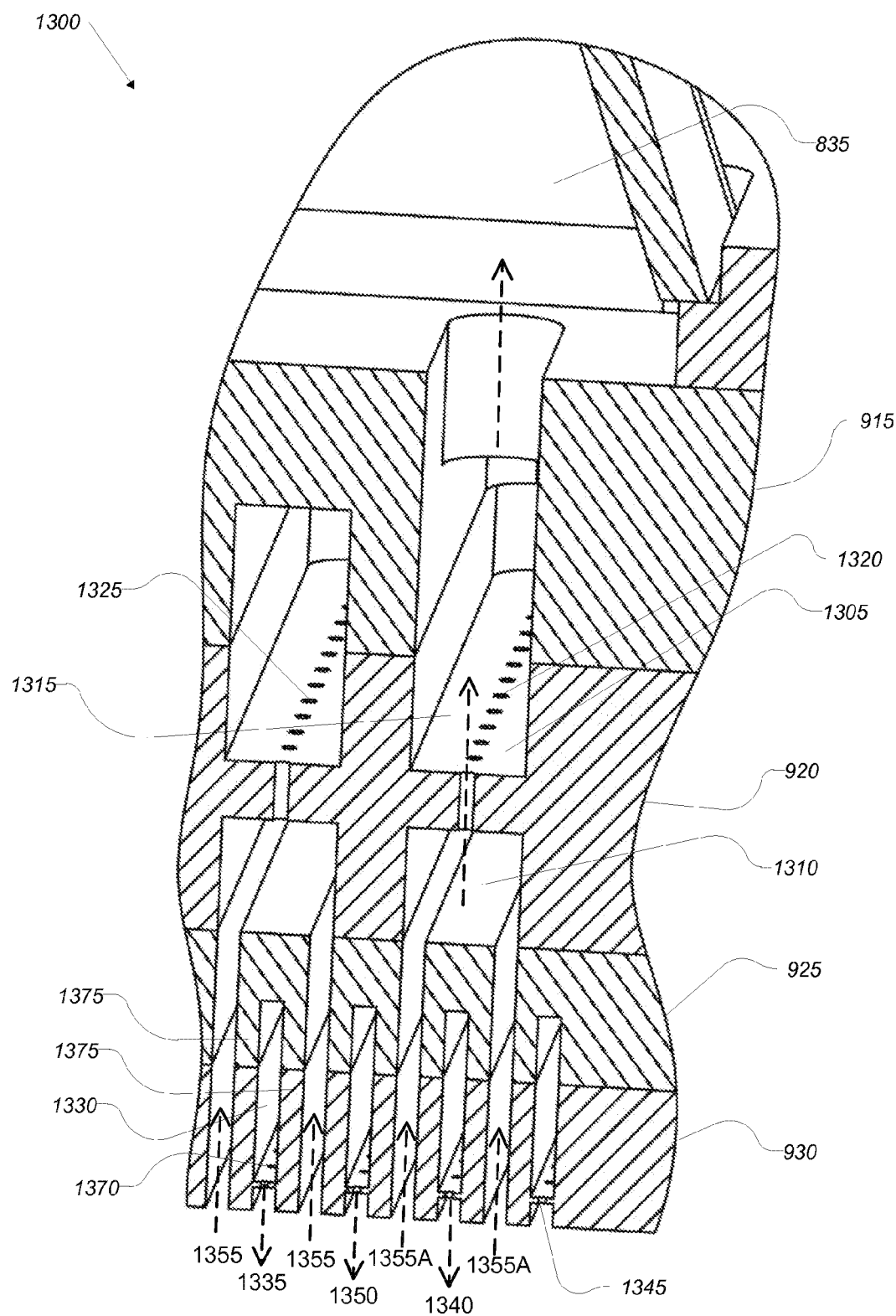
FIG. 13 illustrates an isometric section view of a unit cell of a gas distribution manifold illustrating exhaust gas flow according to one aspect of the present invention.

Referring now to FIGS. 9 and 13, FIG. 9 is a section view taken through section (900-900) of FIG. 8 and FIG. 13 depicts an explodes view (1300) taken from FIG. 9. The exploded view (1300) depicts a unit cell. Referring to FIG. 9, from top to bottom shows a wall of an exhaust manifold (835) which is shown attached to the exhaust collection plate (915) at its base. The exhaust collection plate (915) mates with the exhaust orifice plate (920), which mates with the flow distribution plate (925) and the flow distribution plate mates with the precursor orifice plate (930). Each of the exhaust collection plate (915), the exhaust orifice plate (920), the flow distribution plate (925) and the precursor orifice plate (930) is a substantially rectangular or square plate shaped elements having opposing parallel surfaces separated by a material thickness and substantially equal longitudinal and transverse dimensions. The longitudinal dimension corresponds with a width of the coating surface (Ws) or a coating width of the gas distribution manifold. The transverse dimension corresponds with width of the gas distribution manifold (Wc) which is some multiple of width of a single unit cell, (e.g. 100).

Each of the plates may be gas sealed with respect to its mating plates such as by O-rings, gaskets, or the like, not shown, to prevent gas from leaking out of the distribution manifold from between the plates. Each plate also includes various orifices, channels or the like that extend through or partially through the plates and which serve as fluid conduits for conveying gases through the gas manifold as required. Additionally mating plates may include corresponding surface channels or the like that are joined together when the plates are assembled to form fluid conduits. The plate materials may comprise metal allows, e.g. aluminum or stainless steel or the plates may comprise formable polymer materials e.g. ABS or polycarbonate, or the plates may comprise ceramic materials such as quartz or glass.

Referring to FIG. 13, an example exhaust gas flow path is shown wherein the precursor nozzle assembly (1340) is disposed between opposing exhaust inlets (1355A). As shown, each exhaust inlet (1355A) comprises a longitudinal slot that passes vertically entirely through the precursor orifice plate (930) and entirely through the flow distribution plate (925) to the exhaust orifice plate (920). The exhaust orifice plate (920) includes opposing longitudinal slots (1310) and (1315) that extend from opposing faces of the exhaust orifice plate (920). The opposing slots terminate at a center wall (1305) which includes a plurality of circular orifices (1320) passing there through. The exhaust gas passes through each of the plurality of circular orifices (1320) and flows on to the exhaust collection manifold (835). The orifices (1320) are sized to create a choked flow condition through the center wall (1305) such that gas flow from the longitudinal slot (1310) to the slot (1315) is restricted by the orifices (1320). The restricted gas flow results in drawing a substantially uniform exhaust gas flow through each of the orifices (1320) along the longitudinal length of the center wall (1305). Similarly. the precursor nozzle assembly (1335) is disposed between opposing exhaust inlets (1355) which are substantially identical in construction and operation to the exhaust inlets (1355A) except that the exhaust inlets (1355) may deliver exhaust gasses collected thereby to an alternate exhaust collection manifold (830).

A blower (1485) is in fluid communication with each of the exhaust collection manifolds (830) and (835) and operation of the blower draws exhaust gas out of each of the exhaust collection manifolds (830) and (835). The resulting pressure drop in each of the exhaust collection manifolds (830) and (835) uniformly draws exhaust gas volume through each of the orifices (1320) which draws exhaust gas into each of the exhaust inlets (1355A). Similarly, the precursor nozzle assembly (1335) is disposed between opposing exhaust inlets (1355) which are substantially identical to the exhaust inlets (1355A) except that the exhaust inlets (1355) pass through each of the plurality of circular orifices (1325) and flows to the exhaust collection manifold (830) instead of the exhaust collection manifold (830).

Example Nozzle Assemblies

Referring now to FIGS. 10-13 each of the precursor nozzle assemblies (1005A, 1005B, 1110, 1120, 1335, 1340) and each of the purge nozzle assemblies (1015A, 1015B, 1115A, 1115B, 1350) comprises a longitudinal input chamber (1330) that is bounded by a base wall (1045, 1160A, 1160B, 1165, 1345) and by opposing side walls (1035, 1135, 1375). As best viewed in FIG. 13, each of the longitudinal input chambers (1330) is partially formed in the precursor orifice plate (930) and partially formed in the flow distribution plate (925). As best viewed in FIG. 12, each of longitudinal input chambers associated with a precursor nozzle assembly is fed precursor gas through one of the first and second longitudinal conduits (1240) or (1241) and each of the longitudinal input chambers associated with a purge nozzle assembly is fed inert gas through one of the third longitudinal conduits (1242). Thus appropriate gases enter and fill each of the longitudinal input chambers (1330) from one end thereof. Each of the longitudinal input chambers (1330) extends horizontally along the longitudinal dimension of the precursor orifice plate (930) substantially along the full longitudinal dimension (L) of active portion of the gas manifold and defines a coating width (Ws) of a gas manifold.

Each of the base walls (1045, 1160A, 1160B, 1345) includes a plurality of orifices (1070, 1170, 1370) that extend through the base wall along an axis that is substantially normal to the coating surface. In a preferred embodiment each of the plurality of orifices (1070, 1170, and 1370) is circular with a diameter that is small enough to cause choked gas flow exiting from each of the longitudinal chambers (1330). More specifically choked gas flow results when gas flow out of the longitudinal chambers (1330) is restricted by the circular orifices (1070, 1170, and 1370). The choked gas flow provides an advantage over the prior art in that small cyclic variations in gas pressure and or gas volume within any of the longitudinal input chambers (1330) does not result in corresponding variations in gas volume passing through the orifices (1070, 1170, 1370). Additionally, the choked flow condition leads to a substantially uniform gas volume passing through each of the circular orifices along the full longitudinal length of the longitudinal input chambers (1330). Thus the choked flow condition advantageously exposes the coating surface passing under each gas nozzle assembly to a substantially uniform volume of process gas per unit time and per unit length along the longitudinal axis (L) thereby leading to complete saturation over the system coating width (Ws) during the desired dwell time. Thus the choked flow condition provided by the present invention provides improved coating uniformity at atmospheric pressure while also reducing precursor use. In the example embodiments described above gas orifices (1050, 1170, 1370) that provided the desired choked flow condition comprise circular holes with diameters ranging from 0.025 to 0.127 mm (0.0001 to 0.005 inches). Preferably orifice diameters range from 0.064-0.0165 mm, (0.00025-0.00065 inches). In the example embodiments described above, the gas orifices are spaced apart with center to center or pitch dimension ranging from 0.25 to 10 mm (0.010 to 0.4 inches) and preferably about 3 mm (0.12 inches). Other spacing arrangements that provide the desired uniform gas distribution along the longitudinal axis are usable without deviating from the present invention. In further embodiments the plurality of circular apertures may be replaced by one or more longitudinal slots, one or more oval or other shaped orifices or other orifice patterns that provide the desired uniform gas distribution along the longitudinal axis without deviating from the present invention.

Gas exiting from each of the gas orifices (1070, 1170, 1370) impinges with normal incidents onto the coatings surface with a distribution pattern, which may have a circular diameter. The shape and size of the distribution pattern is at least dependent on the gas density, the separation distance, and other flow characteristics. As noted above, as a result of the choked flow condition the distribution pattern is less dependent on the gas pressure inside the longitudinal input chambers (1330) or the mass flow rate of gas entering the longitudinal input chambers and this improves coating characteristics. Preferably the orifices (1070, 1170, 1370) are uniformly spaced apart along the longitudinal axis with a center to center pitch that provides some overlap of the distribution pattern of adjacent orifices. The center to center spacing and diameter of the circular orifices (1070, 1170, 1370) is selected to uniformly distribute gas volume substantially along the entire longitudinal dimension (L) of the gas manifold (710) which corresponds to the active substrate coating width (Ws).

The size and shape of the orifices passing through bases walls of the purge nozzle assemblies (1015A, 1015B, 1115A, 1115B, 1350) may be different from the size and shape of orifices passing through base walls of the precursor nozzle assemblies (1005A, 1005B, 1110, 1120, 1335, 1340) in order to differentiate between the volume of purge gas and the volume or precursor gas that is directed onto the coating surface. The size and shape of gas orifices passing through base walls of the precursor nozzle assemblies (1005A, 1005B, 1110, 1120, 1335, 1340) may be different for different precursor gasses in order to differentiate the volume of one precursor with respect to another precursor that is directed onto the coating surface. The center to center spacing or pitch of orifices passing through base walls may be varied from one nozzle assembly to another to differentiate gas volume delivery to the coating surface per unit length. For example precursor nozzle assemblies may have a larger or a smaller total number of orifices than purge nozzle assemblies or one precursor nozzle assembly may have a larger or a smaller total number of orifices than another precursor nozzle on the same gas manifold. More generally, according to various embodiments of the present invention the size, shape and pitch of the orifices leading out of the longitudinal input chambers (1330) may be varied in order to adjust gas distribution patterns at the coating surface to more reliably obtain complete saturation at the coating surface. Additionally the separation distances (1030, 1145, 1140 and 1175) may be varied in order to adjust gas distribution patterns in order to more reliably obtain complete saturation at the coating surface.

Example Gas Flow at the Coating Surface

Referring to gas flow lines shown exiting from gas orifices in each of FIGS. 10 and 11, in each of the unit cell embodiments described above the orifices passing through bases walls (1045, 1160A, 1160B, 1325) are oriented substantially along an axis that is normal to the coating surface, which may be a vertical axis. Gas exiting a circular gas orifice may form a substantially conical pattern defining a circular zone over which gas impinges into the coating surface. As described above, the diameter of the circular zone depends on the separation distances (1030, 1140), the gas orifice diameter the gas pressure and to some extend may depend on gas temperature, density, substrate velocity etc. After impinging on the coating surface, the gas is deflected away from the coating surface in the same conical pattern which continues to expand in diameter with increasing distance from the coating surface. Accordingly much of the deflected gas is directed toward the exhaust inlet e.g. (1010B, 1010C, 1105A) where it is quickly removed from the separation distances (1030, 1140, and 1145).

To the extent that a portion of the deflected gas is directed parallel to or nearly parallel to the coating surface, the purge nozzle assemblies (1015A, 1115A, 1350) disposed on opposing sides of the precursor nozzle assemblies deliver a curtain of inert gas into the separation distances (1030, 1145) and the curtain of inert gas tends to prevent precursor gas from flowing or diffusing parallel to the coating surface and preferably confines the precursor to a low pressure area generated by the exhaust inlets (1010A, 1105A) which remove unreacted precursor gas and reaction byproducts from the separation distances (1030, 1140). In some embodiments, it may be preferable to deliver a higher volume of inert gas through the purge nozzle assemblies (1015A, 1115A) in order to prevent precursor from flowing parallel to or nearly parallel to the coating surface. Thus in addition to precursor gas being drawn into the exhaust inlets e.g. (1010A, 1105A) it is desirable that a portion of the inert gas expelled from the purge nozzle assemblies (1015A, 1015B, 1115A, 1115B) and deflected from the coating surface flows through the separation distance (1030) and (1145) toward the adjacent exhaust inlets (1010A) and (1105A).

In each of the unit cell embodiments described above, purge nozzle assemblies are disposed between precursor nozzle assemblies to prevent dissimilar precursors from mixing in the separation distances between the gas precursor orifice plate (930) and the coating surface. In each of the unit cell embodiments described above the separation distances (1030, 1145) are selected to guide unreacted precursor gas and reaction byproducts deflected from the coating surface toward the exhaust inlets (1010) and (1105) to prevent the mixing of dissimilar precursors and to promote rapid and complete reactions between the precursors and the coating surface over the entire coating surface area.

Gas Control System

Figure 14:
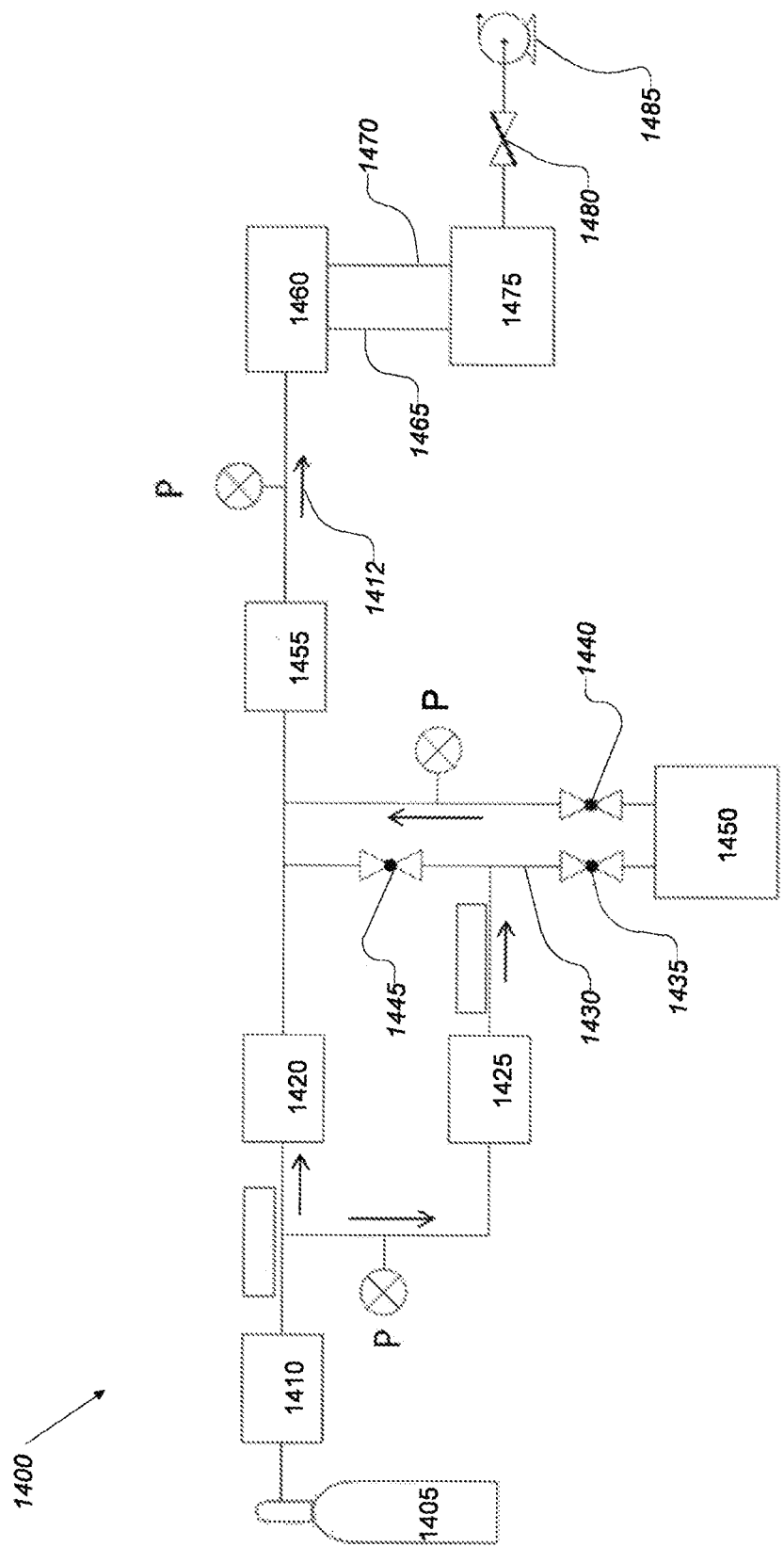
FIG. 14 illustrates a schematic diagram illustrating a gas control system according to one aspect of the present invention.

Referring now to FIG. 14, a gas control system (1400) according to one embodiment of the present invention is shown schematically. The gas control system (1400) includes a gas manifold (1460), such as the gas manifold (710) shown in FIG. 8 and described above. Precursors and inert gas are delivered into the gas manifold (1460) via input lines (1412) e.g. over a plurality of input conduits. The input lines (1412) may include one or more pressure gauges (P), flow meters (1425, 1455) control valves (1435, 1440, 1445) and pressure regulators (1410) and (1420) to regulate gas input pressure and mass flow rate and to modulate precursor input as required. Inert gas is delivered from an inert gas supply (1405) which is pressure regulated by a gas pressure regulator (1410).

The gas control system (1400) further includes a blower (1485) drawing exhaust gas through the manifold (1460). The exhaust gas may be withdrawn through two separate exhaust lines (1465) and (1470) with one gas line (1465) associated with exhaust gas that includes unreacted precursor A and the other gas line (1470) associated with unreacted precursor B respectively. An exhaust gas collection module (1475) is disposed between the blower (1485) and the manifold (1460) for collecting and processing exhaust gas. The exhaust collection module (1475) may comprise a trap for trapping unreacted precursors, a precursor reclaiming module for reclaiming unreacted precursors or both. The exhaust collection module (1475) may also include traps or filtering devices for separating the reaction byproduct from the exhaust gases. The gas control system (1400) may also include a throttle valve (1480) or the like disposed between the gas manifold (1460) and the blower (1485) suitable for adjusting exhaust gas pressure and or mass flow rate.

The gas control system (1400) may include one or more conventional gas bubblers (1450) to vaporize liquid or solid precursors. Alternately or additionally, the system may include one or more gaseous precursor containers that do not require a bubbler. The gas bubbler (1450) contains liquid or solid precursor in a sealed container and inert gas is delivered into the container along flow line (1430). Inert gas input to the bubbler (1450) may be regulated by a pressure regulator (1410) and a mass flow controller (1425). Precursor vapor is released from the bubbler through a control valve (1440). Control valves (1435, 1440, and 1445) may be used to prevent inert gas from flowing into the bubbler (1450) and or to prevent precursor from exiting from the bubble.

Gas controller (1400) delivers inert gas directly to the gas manifold (1460) e.g. into each of the inert gas input ports (825) shown in FIG. 8. Additionally inert gas may be mixed with one or both precursors as a carrier gas such that a mixture or inert gas and precursor vapor are delivered into each of the precursor input ports (815), (820) shown in FIG. 8.

While the present embodiments use a binary precursor system, the invention is not limited to two precursors. The invention is open to any number of precursors necessary to achieve the desired coating goals without deviating from the present invention. Moreover the gas control system (1400) is a schematic representation and may include a plurality of different precursor and inert gas containers, bubblers and flow paths as may be required for a user to configure the gas manifold to apply a variety of different material layers onto a plurality of different substrates.

Deposition Systems Including Substrate Transport Systems

Figure 15:
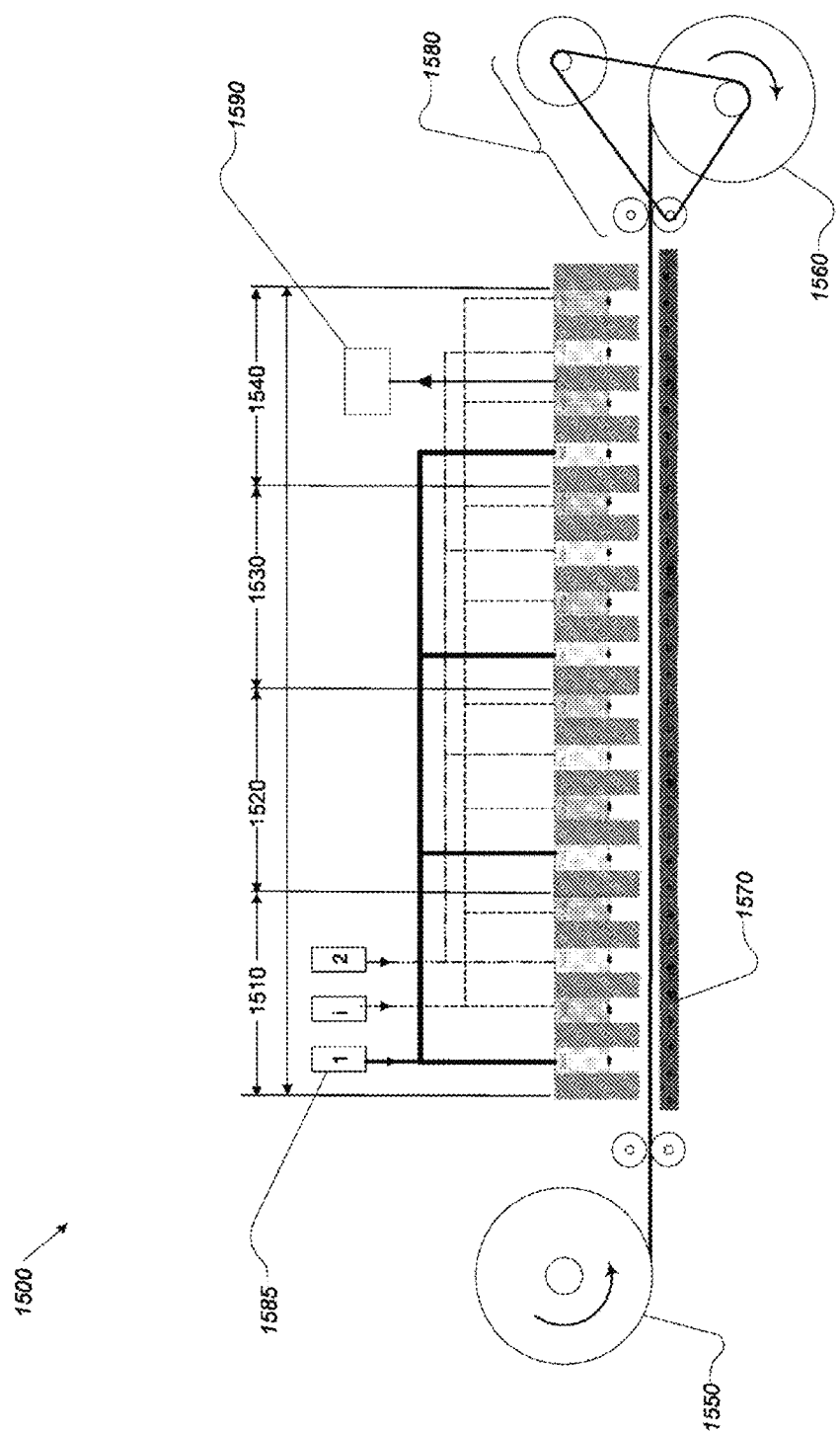
FIG. 15 illustrates a schematic side section view of a deposition system suitable for atmospheric ALD including a moving substrate according to an embodiment of the present invention.
Figure 16:
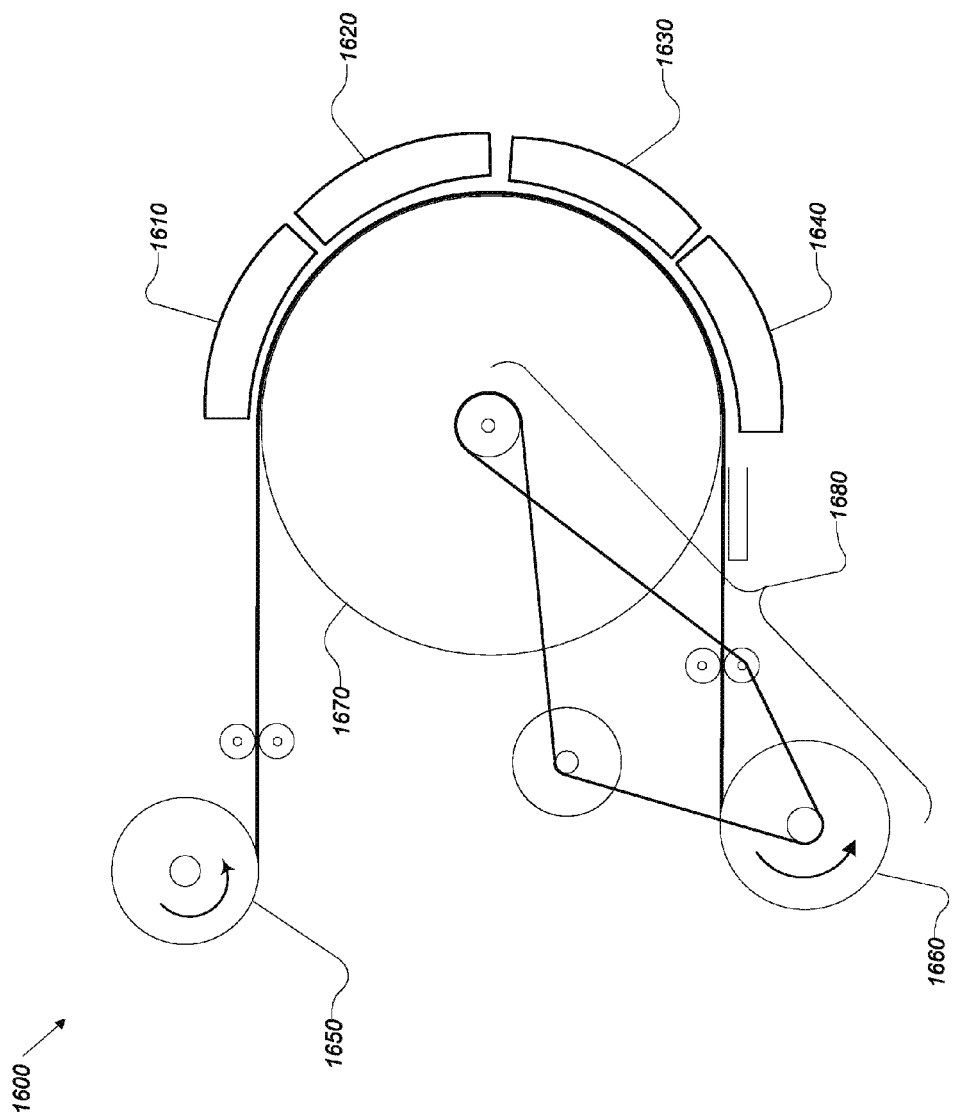
FIG. 16 illustrates a schematic side section view of a deposition system suitable for atmospheric ALD including a moving substrate according to an embodiment of the present invention.

FIGS. 15 and 16 respectively illustrate deposition systems including different substrate transport systems according to embodiments of the present invention.

Referring to FIG. 15, deposition system (1500) includes a substrate transport system that is designed to transport the substrate in a substantially planar configuration beneath a gas deposition head system to deposit a coating on the substrate according to techniques described above. The deposition head system is designed and arranged such that the separation distance between each unit cell and the coating surface of the substrate is substantially the same when the substrate passes beneath the head system. The embodiment of FIG. 15 utilizes the gas deposition head system shown in FIG. 3 which includes four unit cells (1510, 1520, 1530, 1540).

In the embodiment of FIG. 15, the transport system includes a supply roll (1550), which supplies the uncoated substrate, and a take-up roll (1560) on which the coated substrate is collected. During the deposition process, the supply roll (1550) rotates, for example in a counter clockwise direction, to unwind the substrate. In some embodiments and as shown, the substrate may be transported over an optional substrate support (1570) which, when present, can assist in maintaining the substrate in a substantially planar configuration. As the substrate passes beneath the gas deposition head system, a layer is deposited on the coating surface according to techniques described above. In this embodiment, a drive mechanism (1580) rotates the take-up roll (1560) to collect the coated substrate which, in turn, causes the supply roll (1550) to rotate to supply the substrate. However, in other embodiments, a drive mechanism may be associated with supply roll (1550) instead of, or in addition to, the drive mechanism associated with the take-up roll (1560). In addition, the transport system (1500) includes a gas supply module (1585) for delivering precursor and inert gas to corresponding gas nozzle assemblies of each of the unit cells and an exhaust module (1590) for collecting exhaust gas through exhaust channels of the unit cells. In a preferred embodiment, the substrate is advanced past the gas deposition head at an approximately velocity of 24 m/min, each of the gas nozzle assemblies has an approximate nozzle width of 1 mm and the separation distance between the coating surface and a base surface of the deposition head is approximately 0.5 mm. In the example embodiment of FIG. 15 four unit cells are shown with each unit cell depositing a single solid film layer onto the coating surface by an ALD coating process. In other embodiments, the system (1500) may be configured to deposit more solid film layers by increasing the number of unit cells of the deposition head system.

Referring to FIG. 16, deposition system (1600) includes a substrate transport system that is designed to transport the substrate in a curved configuration to deposit a coating on the substrate according to techniques described above. In this embodiment, the deposition head is also curved such that the separation distance between each unit cell (1610, 1620, 1630, 1640) and the coating surface is substantially the same when the substrate passes beneath the head. Similar to the embodiment of FIG. 15, the transport system includes a supply roll (1650), which supplies the uncoated substrate, and a take-up roll (1660) which collects the coated substrate. The transport system includes a curved substrate support element (1670) for maintaining the substrate coating surface equidistant from each of the unit cells (1610, 1620, 1630, 1640). A drive mechanism (1680) rotates the take-up roll (1660) to collect the substrate which, in turn, causes the supply roll (1650) to rotate to supply the substrate. However, in other embodiments, the curved substrate support element (1670) may comprise a roller driven by the a drive mechanism (1680) to advance the coating surface past the unit cells at the desired velocity. Additionally the drive mechanism (1680 may include elements for driving the supply roll (1610).

In all of the above described embodiments, inert gas as well as precursor gas is substantially continuously delivered into the gas manifold (710) through one or more inert gas input ports (825) or through at least one precursor input port (815) and (820) associated with each precursor being used in the coating process. In all of the above embodiments, exhaust gas is substantially continuously removed from the gas manifold (710) through each of a plurality of exit ports (805) and (810). In other embodiments a single exhaust exit port is usable. The exit ports (805) and (810) withdraw gas from the triangular shaped exit plenums (830, 835). In other embodiments a single exit plenum is usable. Each exit plenum mates with an exhaust collection plate (915) and the interface between each exit plenum and the exhaust collection plate is sealed by gaskets, O-rings or the like. In addition, the mass flow rate pressure and temperature of each of the precursors as well as the inert gas may be varied by control systems as needed to achieve complete saturation for a given coating cycle. In other embodiments of the present invention a user may choose to deliver a single precursor gas onto a substrate coating surface, e.g. to promote vapor phase deposition of self-assembled monolayers on the coating surface. In such cases, a single precursor gas may be delivered onto one or all of the input ports (815, 820).

It will also be recognized by those skilled in the art that, while the invention has been described above in terms of preferred embodiments, it is not limited thereto. Various features and aspects of the above described invention may be used individually or jointly. Further, although the invention has been described in the context of its implementation in a particular environment, and for particular applications (e.g. ALD), those skilled in the art will recognize that its usefulness is not limited thereto and that the present invention can be beneficially utilized in any number of environments and implementations in deposition methods such as chemical vapor deposition, physical vapor deposition, plasma etched chemical vapor deposition, and pulsed laser deposition. Accordingly, the claims set forth below should be construed in view of the full breadth and spirit of the invention as disclosed herein.

What is claimed is:

1. A deposition head comprising:
a number of parallel vertical walls defining successive parallel channels therebetween, each of the parallel vertical walls having a bottom surface, the bottom surfaces being coplanar and defining a base surface, every alternate channel of the successive parallel channels being an inert gas channel, the remaining channels of the successive parallel channels being precursor channels, wherein each of the parallel channels is characterized by a same length;
a base wall disposed within every inert gas channel, each base wall spanning a width between the opposing parallel vertical walls defining that inert gas channel, each base wall including an inert gas orifice disposed therethrough, and each base wall being disposed part way along the length of that inert gas channel such that the base wall is recessed from the base surface by a first separation distance that is less than the length of the parallel channels;
a plurality of first precursor nozzle assemblies each recessed from the base surface by a second separation distance, the plurality of first precursor nozzle assemblies being disposed within a first half of the precursor channels;
a plurality of second precursor nozzle assemblies each recessed from the base surface by a third separation distance, the plurality of second precursor nozzle assemblies being disposed within a second half of the precursor channels such that the first and second precursor nozzle assemblies are interleaved.

2. The deposition head of claim 1 further comprising
a plurality of first exhaust channels disposed between the first precursor nozzle assemblies and the two opposing parallel vertical walls on either side thereof, and
a plurality of second exhaust channels disposed between the second precursor nozzle assemblies and the two opposing parallel vertical walls on either side thereof.

3. The deposition head of claim 2 further comprising
a first precursor delivery system for delivering a first precursor to each of the plurality of first precursor nozzle assemblies;
a second precursor delivery system for delivering a second precursor to each of the plurality of second precursor nozzles;
an inert gas delivery system for delivering inert gas to each of the inert gas channels.

4. The deposition head of claim 3 further comprising an exhaust gas removal system for drawing exhaust gas through each of the first exhaust channels and each of the second exhaust channels.

5. The deposition head of claim 4, wherein the exhaust gas removal system keeps separate the exhaust gas drawn from the first exhaust channels from the exhaust gas drawn from the second exhaust channels.

6. The deposition head of claim 1 wherein the first precursor nozzle assemblies each include circular orifices, each orifice having a same diameter, the diameter being in a range from 0.0165 to 0.127 mm.

7. The deposition head of claim 6 wherein the diameter is in a range from 0.025 to 0.064 mm.

8. The deposition head of claim 6 wherein the orifices are spaced apart with a center to center distance of 0.25 to 10 mm.

9. The deposition head of claim 8 wherein the center to center distance is about 3 mm.

10. The deposition head unit cell of claim 1 wherein the first separation distance is in the range of 8 mm to 2 mm.

11. The deposition head of claim 1 wherein the second separation distance is in the range of 9.5 mm to 1 mm.

12. The deposition head of claim 1 wherein the first and second separation distances are the same.

13. A deposition head unit cell comprising:
five parallel walls, each of the walls having a bottom surface, the five bottom surfaces being coplanar and defining a base surface;
a first precursor deposition channel defined between the first and second of the five parallel walls;
a first purge channel defined between the second and third of the five parallel walls;
a second precursor deposition channel defined between the third and fourth of the five parallel walls;
a second purge channel defined between the fourth and fifth of the five parallel walls;
a first precursor nozzle assembly disposed within the first precursor deposition channel and a second precursor nozzle assembly disposed within the second precursor deposition channel, each precursor nozzle assembly having
two parallel side walls defining a gas flow channel therebetween and disposed parallel to the five parallel walls, and
an orifice plate disposed between the two parallel side walls, a bottom surface of the orifice plate defining a plane parallel to a base plane and recessed therefrom by a first separation distance, the orifice plate having a number of orifices defined therethrough;
a first base wall disposed within the first purge channel and a second base wall disposed within the second purge channel, each base wall including a plurality of apertures disposed therethrough, each base wall having a bottom surface defining a plane parallel to the base plane and recessed therefrom by a second separation distance; and
a first exhaust channel defined between the first nozzle assembly and the first of the five parallel walls, a second exhaust channel defined between the first nozzle assembly and the second of the five parallel walls, a third exhaust channel defined between the second nozzle assembly and the third of the five parallel walls, and a fourth exhaust channel defined between the second nozzle assembly and the fourth of the five parallel walls.

14. The deposition head unit cell of claim 13 wherein the first separation distance is in the range of 9.5 mm to 1 mm.

15. The deposition head unit cell of claim 13 wherein the second separation distance is in the range of 8 mm to 2 mm.

* * * * *